United States Patent
Chen et al.

(10) Patent No.: US 7,272,035 B1
(45) Date of Patent: Sep. 18, 2007

(54) CURRENT DRIVEN SWITCHING OF MAGNETIC STORAGE CELLS UTILIZING SPIN TRANSFER AND MAGNETIC MEMORIES USING SUCH CELLS

(75) Inventors: Eugene Youjun Chen, Fremont, CA (US); Yiming Huai, Pleasanton, CA (US)

(73) Assignee: Grandis, Inc., Milpitas, CA (US)

( * ) Notice: Subject to any disclaimer, the term of this patent is extended or adjusted under 35 U.S.C. 154(b) by 0 days.

(21) Appl. No.: 11/217,524

(22) Filed: Aug. 31, 2005

(51) Int. Cl.
*G11C 11/00* (2006.01)

(52) U.S. Cl. ............... 365/158; 365/207; 365/209; 365/210

(58) Field of Classification Search ........... 365/158, 365/207, 209, 210
See application file for complete search history.

(56) References Cited

U.S. PATENT DOCUMENTS

| | | | |
|---|---|---|---|
| 6,055,178 A | 4/2000 | Naji | |
| 6,256,247 B1* | 7/2001 | Perner | 365/209 |
| 6,512,690 B1* | 1/2003 | Qi et al. | 365/171 |
| 6,532,168 B1* | 3/2003 | Swanson et al. | 365/158 |
| 6,552,927 B2 | 4/2003 | Naji | |
| 6,611,455 B2* | 8/2003 | Sekiguchi et al. | 365/171 |
| 6,639,831 B1 | 10/2003 | Pancholy et al. | |
| 6,643,213 B2* | 11/2003 | Perner et al. | 365/230.06 |
| 6,862,215 B1 | 3/2005 | Pancholy et al. | |
| 6,914,806 B2* | 7/2005 | Kunikiyo | 365/158 |
| 6,914,808 B2* | 7/2005 | Inaba | 365/158 |
| 6,956,766 B2* | 10/2005 | Nakamura et al. | 365/171 |
| 7,009,872 B2* | 3/2006 | Alva | 365/158 |
| 7,057,919 B1* | 6/2006 | Jenne et al. | 365/158 |
| 2003/0112657 A1* | 6/2003 | Lu et al. | 365/158 |
| 2006/0279981 A1* | 12/2006 | Diao et al. | 365/158 |

OTHER PUBLICATIONS

John DeBrosse, et al., "*A high-speed 128-kb MRAM core for future universal memory applications*", IEEE Journal of Solid-State Circuits, vol. 39, No. 4, Apr. 2004, 678-683.

Yiming Huai, et al., "*Spin-transfer switching in MgO magnetic tunnel junction nanostructures*", Journal of Magnetism and Magnetic Materials, Jul. 29, 2005.

* cited by examiner

*Primary Examiner*—Hoai V. Ho
(74) *Attorney, Agent, or Firm*—Strategic Patent Group, P.C.

(57) ABSTRACT

A method and system for providing a magnetic memory is described. The method and system include providing a plurality of magnetic storage cells. Each of the plurality of magnetic storage cells includes a magnetic element and a selection transistor. The magnetic element may be programmed using spin transfer induced switching by a write current driven through the magnetic element. The selection transistor includes a source and a drain. The plurality of magnetic storage cells are grouped in pairs. The source of the selection transistor for one magnetic storage cell of a pair shares the source with the selection transistor for another magnetic storage cell of the pair.

11 Claims, 13 Drawing Sheets

CURRENT DRIVEN SWITCHING OF MAGNETIC STORAGE CELLS UTILIZING SPIN TRANSFER AND MAGNETIC MEMORIES USING SUCH CELLS

FIELD OF THE INVENTION

The present invention relates to magnetic memory systems, and more particularly to a method and system for providing memory cells and accompanying circuitry for use in a magnetic memory having cells that can be switched using a spin transfer effect.

BACKGROUND OF THE INVENTION

FIG. 1 depicts a portion of a conventional magnetic random access memory (MRAM) 10. The conventional MRAM 10 includes conventional magnetic elements 12 and 14, conventional write line 16, conventional read and write word lines 18 and 20, respectively, data lines 22 and 24, write selection transistor 26 and read select transistors 28. The conventional magnetic elements 12 and 14, the write selection transistor 26, and read select transistors 28 can be considered to form a conventional magnetic storage cell. The conventional magnetic elements 12 and 14 that are configured to be in opposite high and low resistance states or vice versa. The conventional magnetic elements 12 and 14 are typically magnetic tunneling junctions (MTJs). Consequently, the conventional magnetic elements 12 and 14 have high and low resistance states, respectively, or vice versa.

The conventional MRAM 10 allows for differential reading of the conventional magnetic elements 12 and 14. During reading, the read select transistors 28 may be turned on to allow a read current to flow from the data lines 22 and 24 and through the conventional magnetic elements 12 and 14. Voltage (or current) signal carried by data lines 22 and 24 is fed into the input of a differential sensing amplifier (not shown). Only the difference of the signals are amplified and judged by a logic circuit to determine whether the cell is in a state of "0" or a state of "1". Common mode noises are subtracted out using this differential sensing scheme. A large signal, the difference between maximum resistance and minimum resistances of the two MTJ bits in a cell, is available for sensing for both states. This type of conventional MRAM 10 offers high signal level and a high read speed. During writing, write selection transistor 26 is turned on, so that writing current is only applied to the cell being written. The conventional magnetic elements 12 and 14 in the MRAM 10 is written by turning write selection transistor 26 on, allowing current to flow through the write line 16. This current generates the magnetic field typically used to write to the conventional magnetic elements 12 and 14. Because the use of the write selection transistor 26, the write current is only applied to the cell being written. Consequently, issues due to half select writing cell disturb are reduced.

FIG. 2 depicts another conventional MRAM 10'. The conventional MRAM 10' is analogous to the conventional MRAM 10, and thus has components that are labeled similarly. The conventional MRAM 10' functions in a similar manner to the conventional MRAM 10. However, the write line 16' around the magnetic elements 12' and 14', thereby approximately doubling the magnetic field at the magnetic elements 12' and 14'. Because the magnetic field provided to the magnetic elements 12' and 14' is doubled, the write current may be reduced. The area consumed by a memory cells with a writing transistor is dominated by the size of the write selection transistor 26 or 26'. The size of the write selection transistor 26/26' is determined by the write current through the write selection transistor 26/26'. Doubling the magnetic field from the same current allows a lower write current to be used. Consequently, a smaller write selection transistor 26/26' can be used and the cell size reduced.

FIG. 3 depicts a conventional MRAM memory cell array 50 uses multiples of memory cells 52 in FIGS. 1 and 2. In FIG. 3, the read word lines 62 and write word line 54 run horizontally, while data lines 58 and 60 and write current line 56 run vertically. There are transistor switches at the ends of the lines (not shown) to connect them to power and ground sources. During a writing operation, write word line 54 is activated. Only those cells along the write word line 54 for which the write line 56 is also on are written. During a read operation, read word line 62 is activated. Only those cells along the read word line 62 having data lines 58 and 60 turned on are read. Note that other conventional architectures and other conventional cells exist. For example, some conventional MRAM may utilize reference MTJs in order to read the data stored in the cells. Other conventional MRAM may use magnetic fields produced by vertical bit lines and horizontal digit lines to switch the magnetic elements at their cross points. However, such conventional architectures may suffer from half select disturb problem for cells on the same bit line or digit line that are not intended to be switched.

A current trend in data storage is to increasing density and, therefore, smaller memory cell size. The cell size for the memory cells in the MRAM 10/10' can be determined as follows. The variable f is the minimum feature size for lithography. The memory cells including the magnetic elements 12 and 14 and 12' and 14' shown in FIGS. 1 and 2 extend more than a length of 4 f in the horizontal and vertical directions. This is because there are two word lines 18/18' and 20/20', which utilize at least 4 f in width. There are also two data lines 22/22' and 24/24' that also utilize at least 4 f in width. Note that the minimum metal line width and spacing are typically wider than the minimum lithography width. Therefore, the estimate of 4 f offers a lower limit estimate of cell dimensions. Consequently, the cell size for the MRAMs 10/10' may be at least 16 $f^2$. However, such a small cell size would only allow a very small write selection transistor 26/26' to fit within the cell and underneath the metal lines. If f is 180 nm, then the lateral dimension of the cell is 4 f or 720 nm. A conventional write selection transistor 26/26' having a width of 720 nm would only supply a current of approximately 720 nm×0.0005 mA/nm or 0.36 mA. Such a write current may be one order of magnitude lower than the write current needed to provide a sufficient field for conventional MRAM memory cells. For a write selection transistor 26/26' to control a write current of 6 mA (approximately one order of magnitude greater), a transistor width of 12,000 nm or 67 f is required. It may be possible to fold the gate poly line of the write selection transistor 26/26' no more than three times to fit within the cell. This reduces the effective cell width by a factor of three to about 22 f. Therefore, the minimum cell size for the conventional MRAM 10/10' may be 22 f×4 f=88 $f^2$. In contrast, DRAM (12 $f^2$), Flash (6 $f^2$), and even some SRAM memories (40-100 $f^2$) have significantly smaller cell sizes. In addition, other MRAM cells which use perpendicular bit and digit lines may have a cells size of about 40-50 $f^2$ at f=180 nm, which is also much larger than DRAM and Flash.

Thus although the MRAMs 10/10' is successful in solving some issues, it has a significantly larger cell size and a high cost. Consequently, this scheme may be unattractive for high density nonvolatile memory that is competitive with mainstream semiconductor memories such as SRAM, DRAM and Flash. In addition, other MRAM architectures may also have large cell sizes.

FIG. 4 depicts a graph 80 of the write current versus cell width. As the lithography critical dimension shrinks in the future, the switching field for conventional field switched MRAM, such as the conventional MRAM 10/10' increases dramatically as the cell dimensions are reduced. This is due in part to increased demagnetizing effect in smaller magnetic elements. In addition, smaller magnetic elements have a lower thermal stability due to their shrinking volume. Consequently, smaller magnetic elements have a larger energy barrier to allow them to be thermally stable. For an MTJ, this is achieved by making the free layer thicker and harder to switch (requiring a higher write current). A higher write current translates into larger cell size, higher power consumption, and slower memory operation.

The phenomenon of spin transfer can be used as an alternative to or in addition to using an external switching field to switch the direction of magnetization of the free layer of a magnetic element, such as a conventional spin valve, MTJ, dual spin valve, dual MTJ, or other analogous structure. As can be seen in FIG. 4, the use of spin transfer is particularly attractive at lower cell dimensions and, therefore, lower write currents. To use the spin transfer effect to program a conventional MTJ to a first state, such as a logical "1", current is driven through the magnetic element in a first direction. To use the spin transfer effect to program the magnetic element to a second state, such as a logical "0", current is driven through the magnetic element in the opposite direction. To read the magnetic element a read current, which is less than the write current, is driven through the magnetic element. The output voltage or current can be compared to a reference voltage or current to determine whether a logical "0" or a logical "1" is stored in the magnetic storage cell.

Although magnetic elements utilizing spin transfer as a programming mechanism can be used in principle, one of ordinary skill in the art will readily recognize that there may be drawbacks. For example, the size of the magnetic storage cell may be large due to the currents driven through the magnetic element during a write operation. In addition, the write current driven through the selection transistor in opposite directions to program opposite states may be asymmetric. One of ordinary skill in the art will readily recognize that a current driven from the source to drain may be different from the current driven from the drain to the source for similar applied voltages. This asymmetry may be seen as follows. Assume that the magnetic element, for example an MTJ, is coupled with the drain of the transistor. The transistor drain current is given by the following equations under different conditions.

$$I_D = \mu C_{ox} \frac{W}{L}(V_{GS} - V_T)V_{DS}, \quad \text{for } |V_{DS}| \ll (V_{GS} - V_T) \quad \text{Eq. (1)}$$

$$I_D = \mu C_{ox} \frac{W}{L}\left[(V_{GS} - V_T)V_{DS} - \frac{V_{DS}^2}{2}\right], \quad \text{for } V_{DS} < V_{GS} - V_T \quad \text{Eq. (2)}$$

$$I_{D,sat} = \mu C_{ox} \frac{W}{L}\frac{(V_{GS} - V_T)^2}{2}, \quad \text{for } V_{DS} > V_{GS} - V_T \quad \text{Eq. (3)}$$

Eq. (1) applied for a transistor under MTJ element reading condition, where the bias voltage and current through the MTJ and transistor is lower. The maximum value $I_D$ of Eq. (2) equals the value Of, $I_{D,sat}$ in Eq. (3). This is the current desired during a writing operation to provide substantially a maximum current possible through a minimum sized transistor. Such a situation may allow for a smaller transistor, smaller magnetic storage cell sizes and, therefore, a higher density spin transfer based memory. There is a limit to how large a $V_{GS}$ can be applied in order to ensure that a maximum electric field for the transistor is not exceeded and transistor gate oxide reliability problems are avoided. For a 90 nm node, the gate voltage is usually less than 1.2 volts. If $V_T$ is made to be 0.2 volts, then $V_{DS}$ beyond 1.0 volt saturates the $I_D$ value. When $V_{DS}$ is significantly greater $V_{GS}$, hot electron reliability problems may occur. Using this information, it is possible to calculate the writing current that can be provided by a particular transistor. Such a calculation indicates that not only are the writing currents are asymmetric for writing the two states, but also there is a large loss in switching current in at least one writing case.

Accordingly, what is needed is a magnetic memory that may be suitable for higher densities and preferably utilizing a localized phenomenon for writing, such as spin transfer. The present invention addresses such a need.

BRIEF SUMMARY OF THE INVENTION

The present invention provides a method and system for providing a magnetic memory. The method and system include providing a plurality of magnetic storage cells. Each of the plurality of magnetic storage cells includes a magnetic element and a selection transistor. The magnetic element may be programmed using spin transfer induced switching by a write current driven through the magnetic element. The selection transistor includes a source and a drain. The plurality of magnetic storage cells are grouped in pairs. The source of the selection transistor for one magnetic storage cell of a pair shares the source with the selection transistor for another magnetic storage cell of the pair.

According to the method and system disclosed herein, the present invention provides a mechanism for programming and reading a magnetic memory including magnetic elements that are programmable by a write current driven through the magnetic elements, for example through the phenomenon of spin transfer.

DETAILED DESCRIPTION OF THE INVENTION

The present invention relates to a magnetic memory. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides a method and system for providing a magnetic memory. The method and system include providing a plurality of magnetic storage cells. Each of the plurality of magnetic storage cells includes a magnetic element and a selection transistor. The magnetic element may be programmed using spin transfer induced switching by a write current driven through the magnetic element. The selection transistor includes a source and a drain. The plurality of magnetic storage cells are grouped in pairs. The source of the selection transistor for one magnetic storage cell of a pair shares the source with the selection transistor for another magnetic storage cell of the pair.

The present invention is described in the context of particular magnetic memories having certain components. One of ordinary skill in the art will readily recognize that the present invention is consistent with the use of magnetic memories having other and/or additional components. Furthermore, the present invention is described in the context of components corresponding to certain portions of the memory. For example, word line selectors are described as corresponding to a certain number of magnetic storage cells. However, one of ordinary skill in the art will readily recognize that the components could correspond to another number of elements, for example word line selectors might correspond to another number of magnetic storage cells. The method and system in accordance with the present invention are also described in the context of reading from or writing to a single magnetic storage cell. The present invention is described in the context of certain memories. However, one of ordinary skill in the art will readily recognize that the present invention is compatible with memories not inconsistent with the present invention. The present invention is also described in the context of current understanding of the spin transfer phenomenon. Consequently, one of ordinary skill in the art will readily recognize that theoretical explanations of the behavior of the method and system are made based upon this current understanding of spin transfer.

Figure 1:
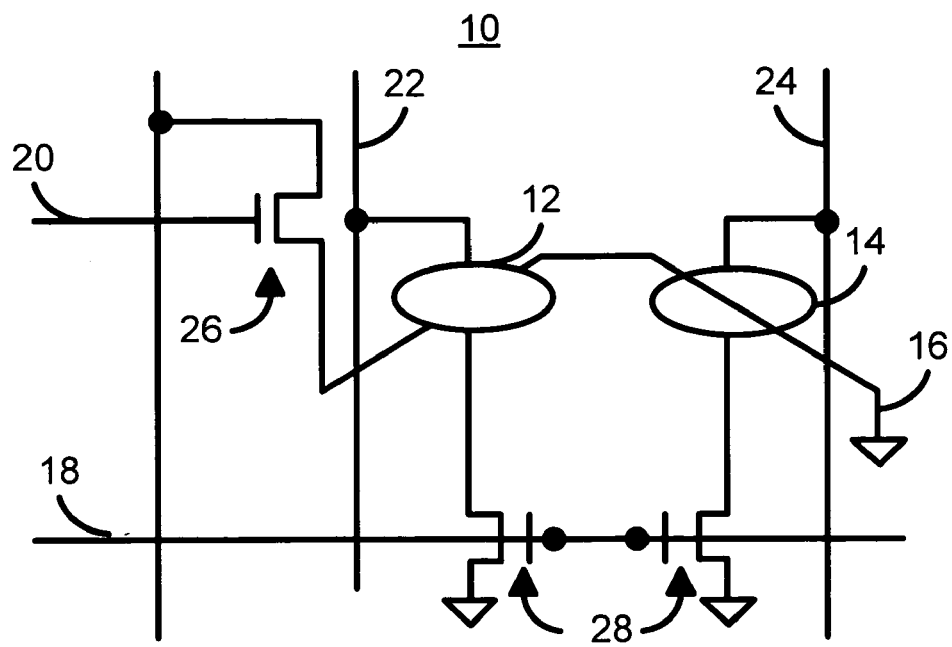
FIG. 1 is a diagram of a conventional magnetic random access memory.
Figure 2:
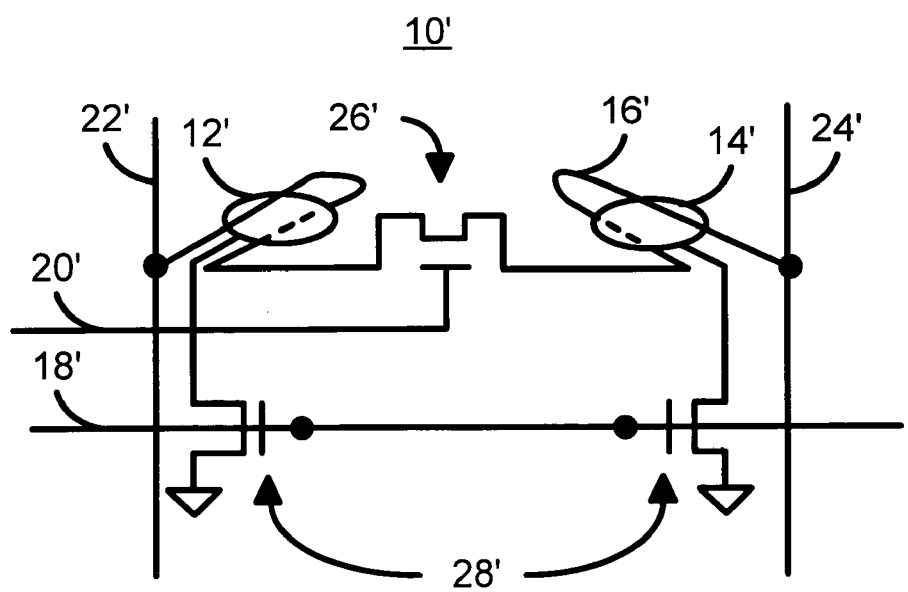
FIG. 2 is a diagram of another conventional magnetic random access memory.
Figure 3:
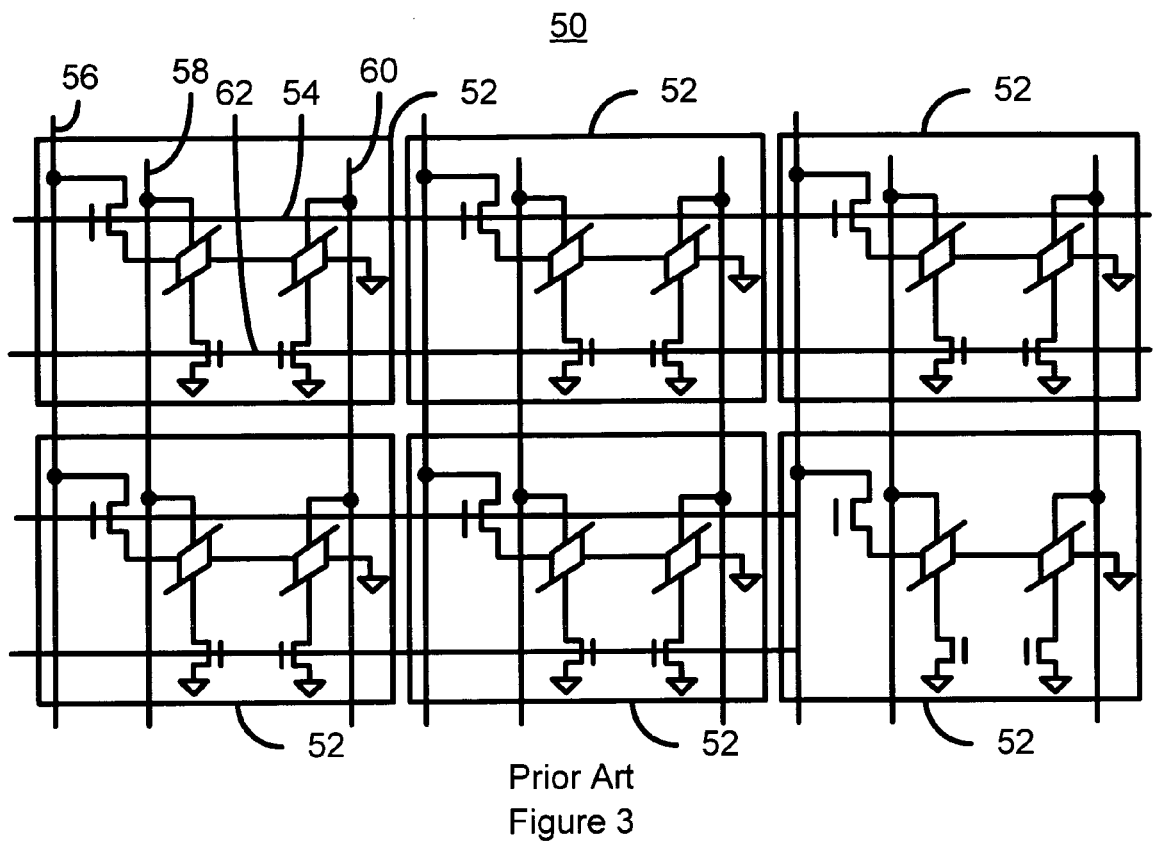
FIG. 3 is a diagram of another conventional magnetic random access memory.
Figure 4:
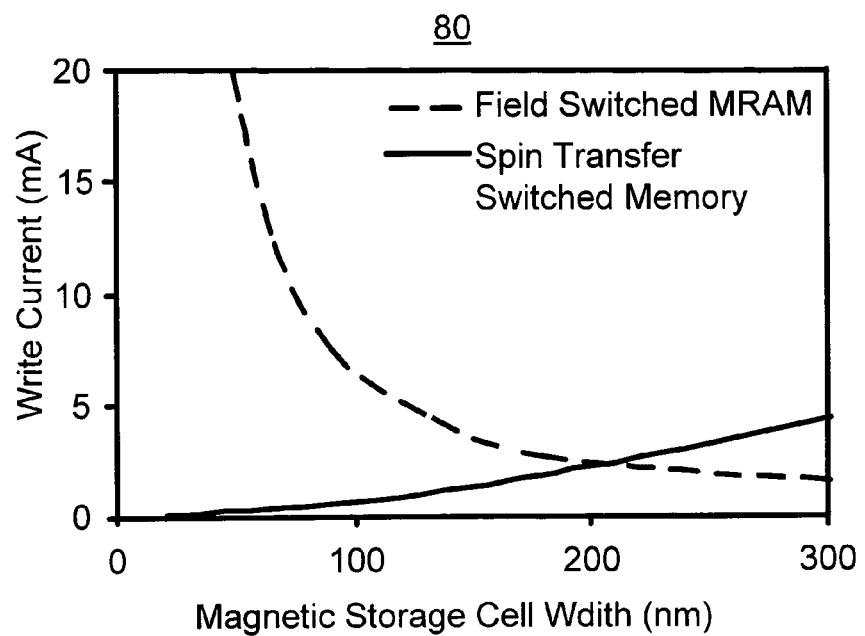
FIG. 4 is a graph depicting the switching current versus magnetic storage cell width for conventional MRAM and MRAM switched using the spin transfer effect.
Figure 5:
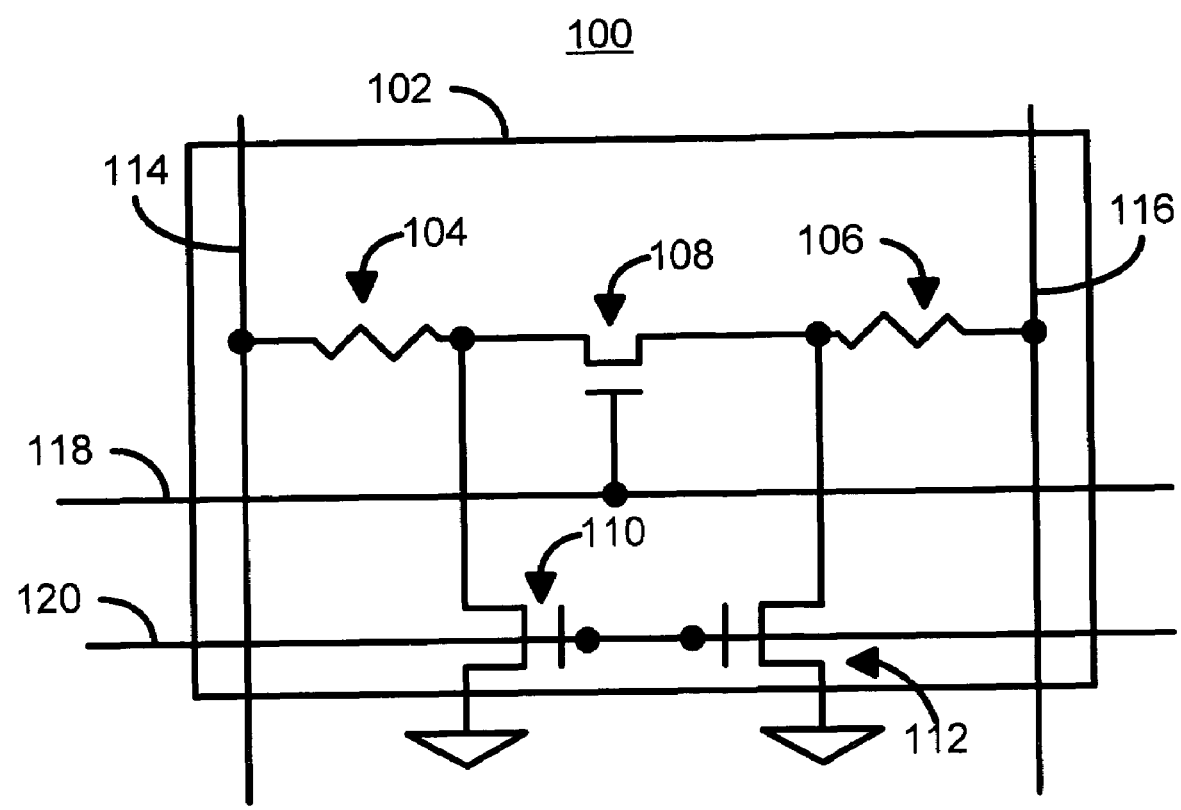
FIG. 5 is a diagram of a portion of one embodiment of a magnetic memory in accordance with the present invention.

FIG. 5 is a diagram of a portion of one embodiment of a magnetic memory 100 in accordance with the present invention. The magnetic memory 100 includes a magnetic storage cell 102, which includes magnetic elements 104 and 106 and transistors 108, 110, and 112. The magnetic memory 100 also includes data lines 114 and 116, as well as write word line 118 and read word line 120. The magnetic elements 104 and 106 are programmed by driving a write current through the magnetic elements 104 and 106. Thus, the magnetic elements 104 and 106 are programmed using the spin transfer effect. The magnetic elements 104 and 106 provide a signal via magnetoresistance. In a preferred embodiment, the magnitudes of the magnetoresistances of the magnetic elements 104 and 106 are substantially equal. In one embodiment, the magnetic elements 104 and 106 may be MTJs, dual MTJs, or other magnetic element which can be programmed using spin transfer and which provide a read signal using magnetoresistance. The magnetic elements 104 and 106 are also configured to be in opposite states. For example, if the magnetic element 104 is in a high resistance state, the magnetic element 106 is in a low resistance state, and vice versa. The transistors 108, 110, and 112 are preferably CMOS transistors. The transistor 108 is a write selection transistor. Transistors 110 and 112 are read selection transistors.

In operation, the magnetic storage cell 102 is preferably written using the spin transfer effect and read based on the magnetoresistances of the magnetic elements 104 and 106. During a writing operation, the write transistor 108 is turned on by activating writing word line 118. A voltage difference established between data lines 115 and 116. This voltage difference depends upon the states desired to be programmed. To program the magnetic element 104 to a first state, such as a logical "1", data line 114 may be set at a higher voltage, such as $V_{DD}$ or another write voltage, while data line 116 may be set at a lower voltage such as ground or a negative voltage. Consequently, a write current is driven through the magnetic element 104 in a first direction, e.g. from top to bottom in a MTJ in the CPP configuration. The current is, therefore, also driven through the magnetic element 106. As discussed above, the magnetic elements 104 and 106 are configured to have opposite states. Consequently, driving the write current through the magnetic element 104 in the first direction results in the write current being driven through the magnetic element 106 in a second direction, e.g. from bottom to top in an MTJ in the CPP configuration. Thus, the magnetic elements 104 and 106 are programmed to opposite states. To program the magnetic element 104 to a second state, such as a logical "0", data line 116 may be set at a lower voltage which may be ground or a negative voltage and data line 114 may be set at a higher, write voltage. Current is driven through the magnetic element 104 in the opposite direction, e.g. from bottom to top in a CPP configuration. Again, current is driven in the opposite direction through the magnetic element 106. The magnetic element 106 is thus written to a different state than the magnetic element 104.

During reading, the read selection transistors 110 and 112 are turned on using the read word line 120. The data lines 114 and 116 may supply the same read voltage. In a preferred embodiment, the read voltage is in a range at least fifty and no more than five hundred milli-volts. Consequently, a read current is driven through the magnetic elements 105 and 108 and the read selection transistors 110 and 112. Because the magnetic elements 104 and 106 have different states, the currents flowing through the magnetic elements 104 and 106 are different for the same applied read voltage. Based on these currents, the status of the magnetic storage cell 102 can be determined.

Figure 6:
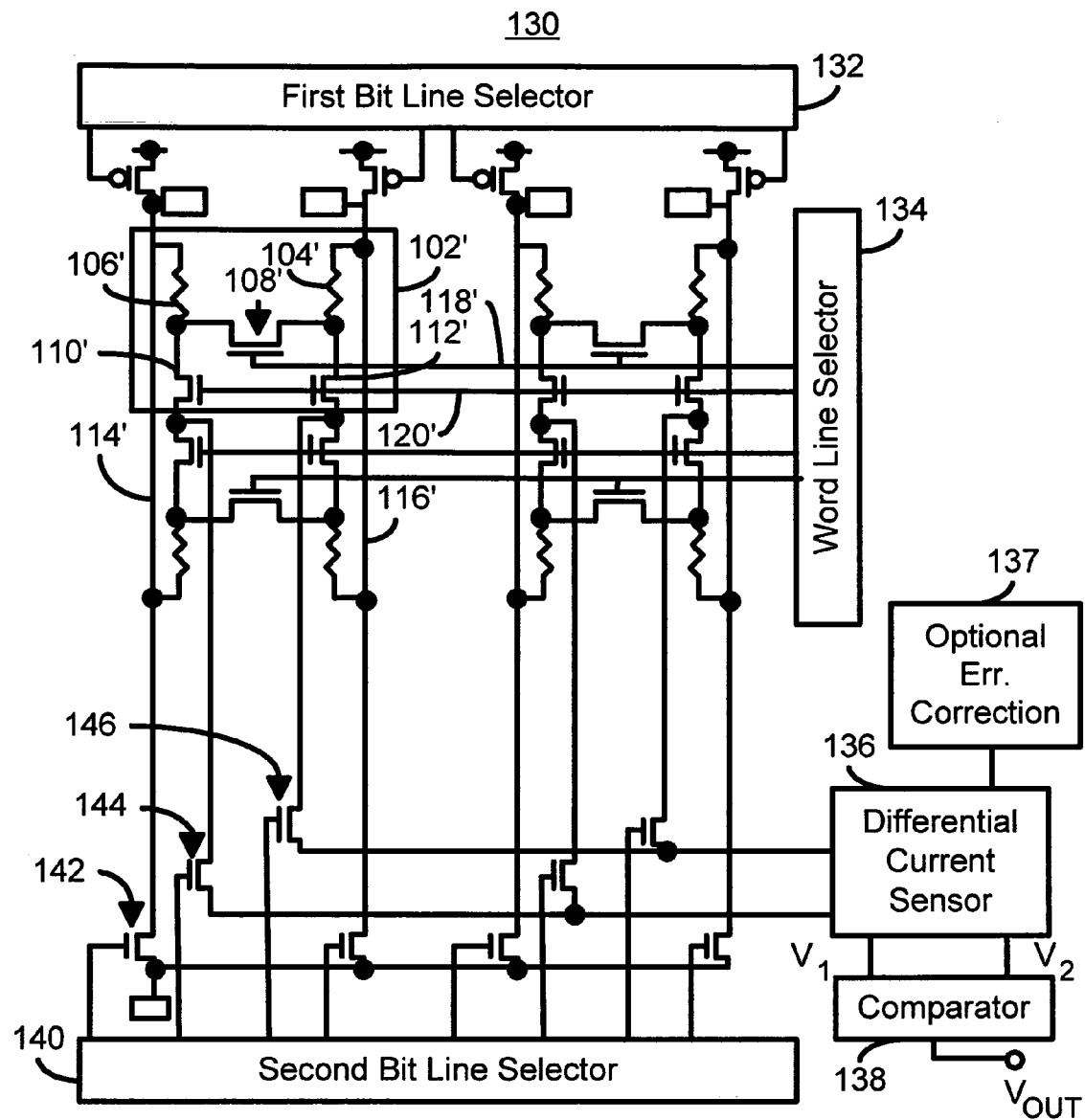
FIG. 6 is a diagram of a portion of one embodiment of architecture a magnetic memory in accordance with the present invention.

FIG. 6 is a diagram of a portion of one embodiment of architecture a magnetic memory 130 in accordance with the present invention. The magnetic memory 130 utilizes the magnetic memory cell 102, designated 102' in FIG. 6. The magnetic memory 130 also includes data lines 114' and 116', word lines 118' and 120' coupled with write selection transistor 108' and read selection transistors 110' and 112', respectively. The magnetic memory 130 also includes first bit line selector 132, word line selector 134, differential current sensor 136, comparator 138, second bit line selector 140, and transistors 142, 144, and 146. The first bit line selector 132 controls access to current sources, while the second bit line selector 140 controls the current sinks. The word line selector 134 controls the write selection transistor 108' and the read selection transistors 110' and 112'. The differential current sensor 136 and comparator 138 are used to provide differential reading of the magnetic elements 104' and 106'. In an alternate embodiment another read scheme and/or voltage based reading could be used.

To program a particular cell, the first bit line selector 132 activates the bit line 114' or 116', depending upon the state desired to be programmed. The bit line selector 140 couples the bit line 116' or 114' to a current sink. The write selection transistor 108' is also activated by the word line selector 134. Consequently, the write current flows from the upper left to the lower right or from the upper right to the lower left in FIG. 6. The magnetic memory cell(s) 102' may thus be programmed as described above. In addition simultaneous writing of cells 102' may be performed in parallel.

During a reading operation, the second bit line selector 140 selects which of the cells 102' is to be read. The second bit line selector 140 thus connects the appropriate magnetic elements 104' and 106' to the differential current sensor 136 through transistors 144 and 146. The word line selector 134 also selects which row of cells to be read by activating the appropriate read transistors 110' and 112'. The first bit line selector 132 activates the appropriate data lines 114' and 116'. Because the magnetic elements 104' and 106' have different states, the current through the transistors 110' and 112' may differ. These differing currents are provided to the differential current sensor 136. The comparator 138 compares the output of the differential current sensor 136 to determine the state of the magnetic cell. For simplicity, only one differential current sensor 136 and comparator 138 are shown in FIG. 6. For a single differential current sensor 136 and comparator 138, only sequential sensing may be performed. However, in an alternate embodiment, more differential current sensors and comparators may be added for different bit lines. In such an embodiment, simultaneous 8 bit, 16 bit, 32 bit, or 64 bit read operations may be performed. Thus, the architecture 130 allows the magnetic storage cell 102/102' to be programmed and read.

Furthermore, the magnetic memory 130 may include optional error correction circuitry 137. It is possible that at least some magnetic elements 104, 106, 104' or 106' in the magnetic memory 130 have varying resistance. Variations in resistance could be caused by issues including but not limited to thin tunnel barrier hot spot problems, barrier impurity mobile ion problems, and barrier mobile defect (trap) problems. Resistance variation problems of magnetic elements 104, 106, 104', or 106', such as MTJs, can potentially cause errors in memory chip operation. Consequently, error correction circuitry 137 may be present in the magnetic memories 130 or 130'. Error correction circuitry 137 could take various forms, such as the addition of checker bits in one embodiment. In another embodiment, error correction may include but is not limited to a self referencing scheme. In a self referencing scheme, cell 104, 106, 104', or 106' may be read first. The state is stored in a bit register, a capacitor, or provided to an auto-zero circuit in which a bias voltage is adjusted to the first reading voltage. A "1" may then be written to the particular cell 104, 106, 104', or 106'. The cell is then read again. The resultant of the second read operation is compared with the resultants of the first read operation. Signal from the second read operation is compared with that from the first read operation. If the resultants of the two reads are identical, then the cell was in the logical "1" state. If the second signal is different from the first signal, then the cell was in the logical "0" state. In this case, the cell is written back to the "1" state after the second reading is completed. Such self referencing may require a longer read operation, but may be necessary if material technology is not good enough to eliminate resistance variation problems in the near term.

Figure 7:
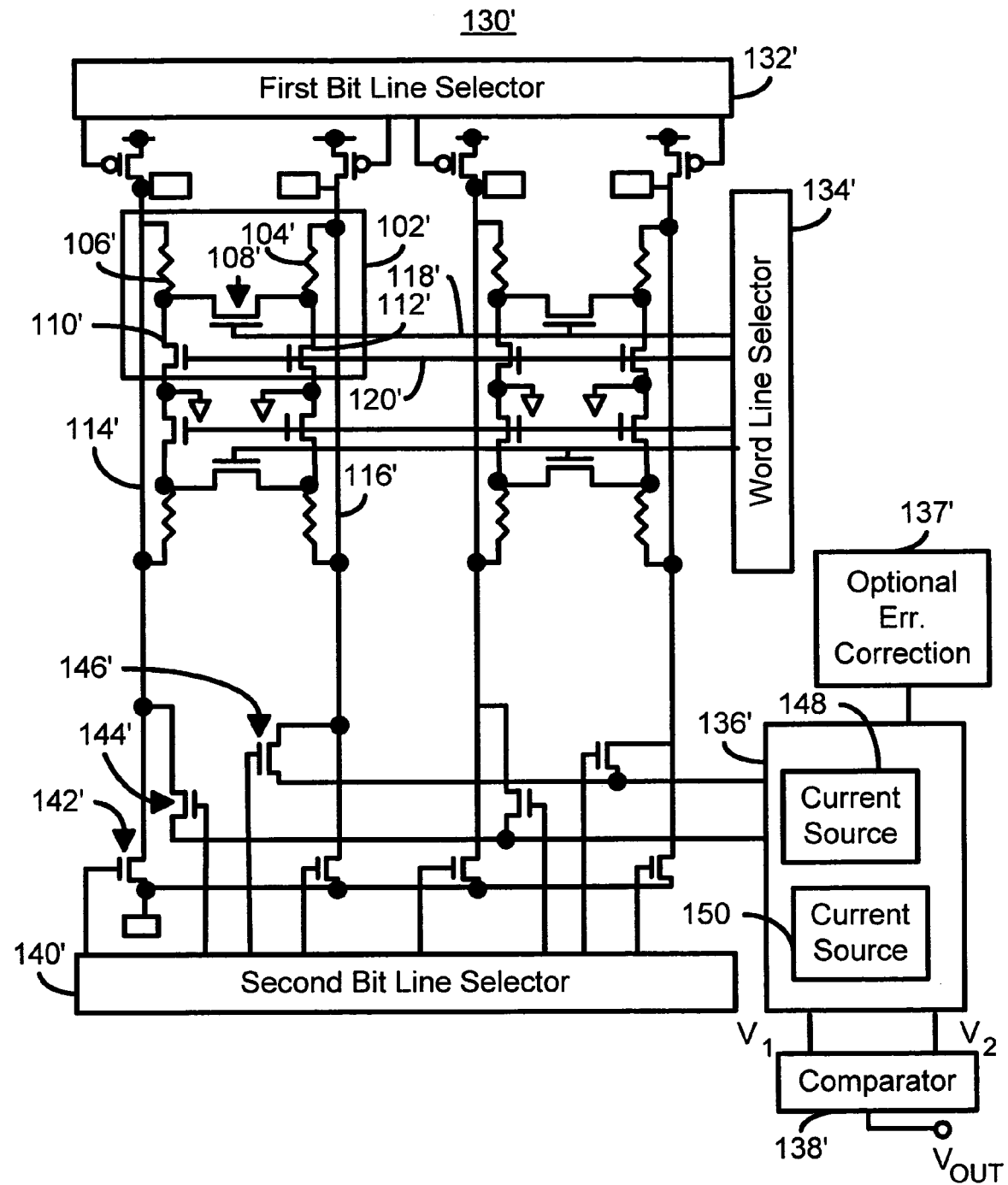
FIG. 7 is a diagram of a portion of another embodiment of architecture of a magnetic memory in accordance with the present invention.

FIG. 7 is a diagram of a portion of another embodiment of architecture 130' of a magnetic memory in accordance with the present invention. Portions of the architecture 130' are analogous to that of the architecture 130. Consequently, such portions are labeled similarly. The magnetic memory 130' utilizes the magnetic memory cell 102'. The magnetic memory 130' also includes data lines 114' and 116', word lines 118' and 120' coupled with write selection transistor 108" and read selection transistors 110' and 112', respectively. The magnetic memory 130' also includes first bit line selector 132', word line selector 134', differential current sensor 136', optional error correction circuitry 137', comparator 138', second bit line selector 140', transistors 142', 144', and 146'. The differential current sensor 136' and comparator 138' are used to provide differential reading of the magnetic elements 104' and 106'. In an alternate embodiment another read scheme and/or voltage based reading could be used.

The magnetic memory 130' writes to magnetic storage cells 102' in substantially the same manner as the magnetic memory 130. However, the differential current sensor 136' includes current sources 148 and 150. Consequently, the magnetic memory 130' may utilize an alternative read scheme. The current sources 148 and 150 are preferably identical. One current source 148 provides current for the bit line 114', while the other current source 150 provides current corresponding to the bit line 116'. In a preferred embodiment, a portion of the current from the current source 148 or 150 is provided to the bit lines 114' or 116', respectively, with a clamped bit line bias voltage. In one embodiment, the bit line bias voltage is clamped in the range of 50-500 mV regardless of the resistance of the elements 104' or 106'. Consequently, a high MR signal can be obtained during sensing. The remainder of the current from the current source 148 or 150 is provided to a resistor or another transistor (not shown), to amplify and sense the voltage drop.

Thus, the magnetic memories 130/130' allows for differential reading. Consequently, a large read signal, high read speed, and rejection of common mode noise may be achieved. Moreover, the read transistors 110' and 112' are back to back along the same bit line, sharing the same source or drain region to save space on the chip. As a result, the writing path is symmetric regardless which direction the current flows. Consequently, the same magnitude of current will be obtained when writing to opposite states.

In addition, the magnetic cell 102/102' may have a size that is reduced below that of conventional MRAM 10/10'. The critical current density for spin transfer switching depends on many factors, including the spin polarization of the conductor electrons impinging on the free layer of the magnetic element 104/104' or 106/106'. Recent advances, for example the use of a crystalline MgO barrier layer in an MTJ, may provide enhanced polarization. Such higher polarization of the write current may reduce the critical current density required to switch the state of a magnetic element 104/104' or 106/106'. Currently, a critical switching current density of approximately 2 $MA/cm^2$ may be achieved. It is assumed that the magnetic element 104/104' and/or 106/106' is on the order of 90 nm by 160 nm. For such a magnetic element 104/104' and/or 106/106', the write current to provide the appropriate critical current density needs for fast switching on the order of one nanosecond is 0.288 mA. If f (minimum feature size) is approximately 90 nm, then the write transistor 108 has a width of 576 nm, or 6.4 f. This size can be reduced below the metal width of 4 f by folding the long poly width. Thus, a true metal limited cell size of 16 $f^2$ can be realized for a magnetic memory cell 102/102' switched using the spin transfer effect. This cell size is much smaller than that of the conventional MRAM 10/10', which was on the order of 88 $f^2$. This improvement over conventional MRAM is even more dramatic when the increasing current required for a smaller field-switched cell, such as the MRAM 10/10' is taken into account. Moreover, this cell size is smaller than that of SRAM, and in a range that is competitive with DRAM and Flash.

Figure 8:
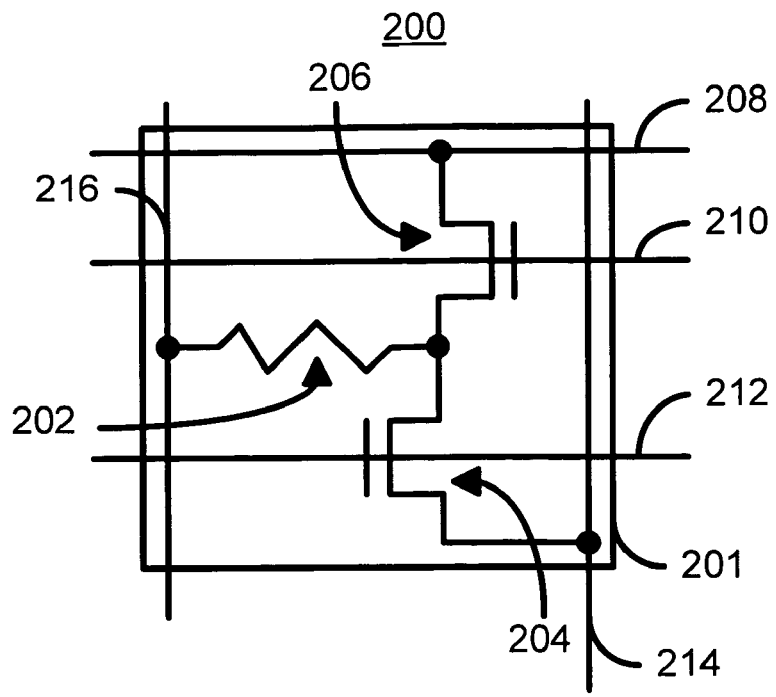
FIG. 8 is a diagram of a portion of another embodiment of a magnetic memory in accordance with the present invention.

FIG. 8 is a diagram of a portion of another embodiment of a magnetic memory 200 in accordance with the present invention. The magnetic memory 200 includes a cell 201 including a magnetic element 202, read selection transistors 204, and write selection transistor 206. Thus, the magnetic memory cell 201 includes a single magnetic element 202. The magnetic memory 200 also includes source line 208, word lines 210 and 212, sense line 214, and bit line 216. The magnetic element 202 is programmed by driving a write current through the magnetic element 202. Thus, the magnetic element 202 is programmed using spin transfer. The magnetic element 202 provides a signal via magnetoresistance. In one embodiment, the magnetic element 202 may be a MTJ, dual MTJ, or other magnetic element which can be programmed using spin transfer and which provide a read signal using magnetoresistance. The transistors 204 and 206 are preferably CMOS transistors.

In some embodiments, the write select transistor 206 and read select transistor 204 may share one source or drain because the transistors 204 and 206 are arranged back to back. Moreover, the other source/drain of the write transistor 206 may be shared with the next cell. Similarly, the other source/drain of the read transistor 204 might be shared with the next cell (not shown) on the other side. Consequently, the magnetic memory 200 has one less bit line per cell than the magnetic memory 100/100' and allows for shared source/drain regions for the transistors 204 and 206. As a result, the magnetic memory 200 using the cell 201 may be utilized in a higher density architecture.

Figure 9:
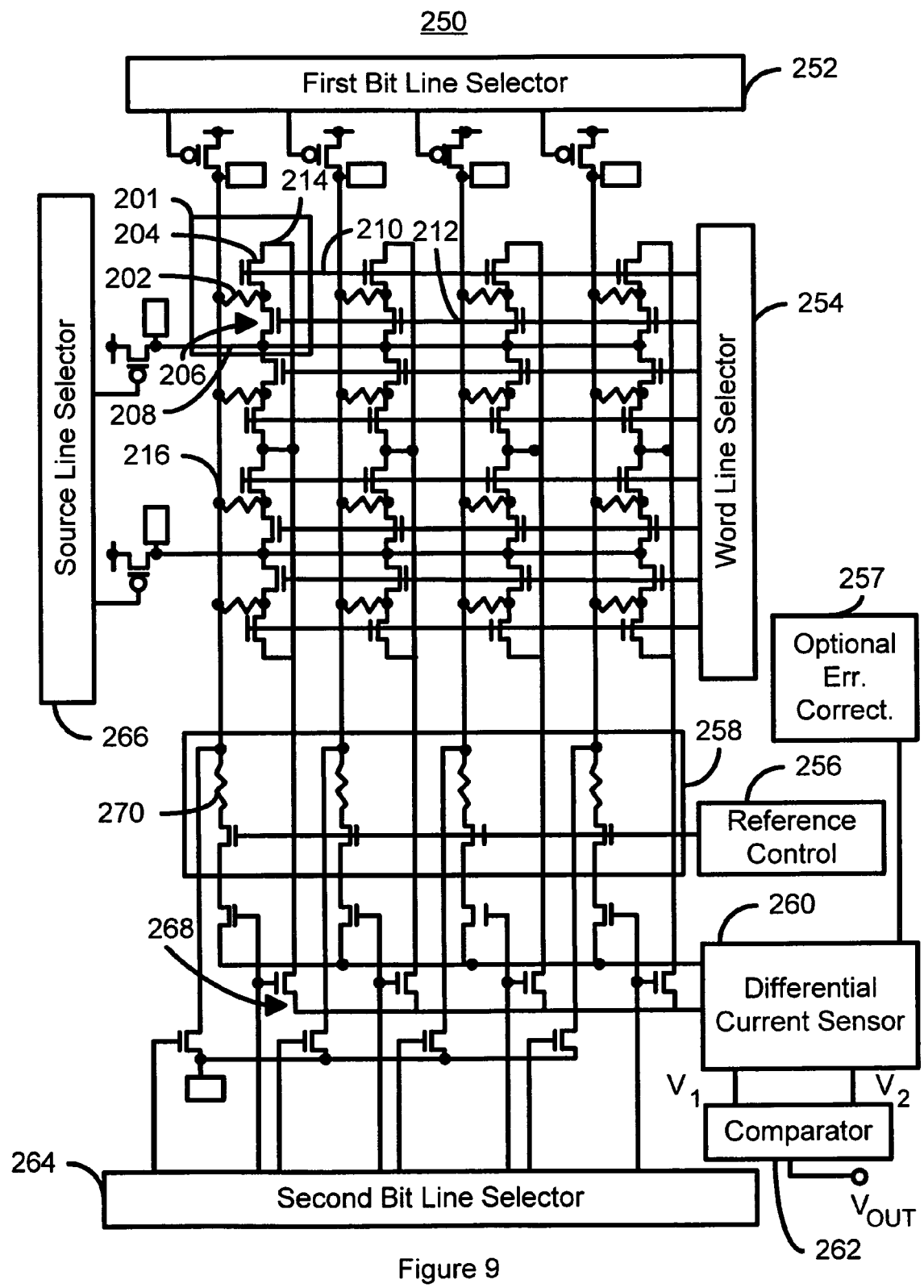
FIG. 9 is a diagram of a portion of another embodiment of architecture of a magnetic memory in accordance with the present invention.

FIG. 9 is a diagram of a portion of another embodiment of architecture 250 of a magnetic memory in accordance with the present invention. The magnetic memory 250 utilizes the magnetic storage cells 201 shown in FIG. 8. Referring back to FIG. 9, the magnetic memory 250 includes cell 201 including a magnetic element 202 and read selection transistors 204 and write selection transistor 206, source line 208, word lines 210 and 212, bit line 216, first bit line selector 252, word line selector 254, reference control 256, reference cells 258, differential current sensor 260, comparator 262, second bit line selector 264, source line selector 266, transistor 268, and reference element 270. The first bit line selector 252 and source line selector 266 control power and current source(s), while the second bit line selector 264 controls current sink(s). The word line selector 254 controls both read selection transistor 204 and write selection transistor 206. Reference control 256 controls the reference cells 258 for reading. The differential current sensor 260 is coupled with the reference cells 258 and selectively coupled with the appropriate one(s) of the magnetic storage cells 201. The differential current sensor 260 and comparator 262 are used to provide differential reading of the magnetic element 202. In an alternate embodiment another read scheme and/or voltage based reading could be used.

In operation, the magnetic storage cells 201 may be written or read as follows. During a writing operation, the source line selector 266 turns on the row of the cell being written and supplies a low voltage for writing to one state and a high voltage for writing to another state. The low voltage which is preferably constant and may be Vdd/2 or another low voltage, including zero. The high voltage is preferably constant and may be Vdd. Word line selector 254 activates the write select transistors 206 of the cell 201 being written. In one embodiment, the write select transistor 206 is configured to provide equal and, preferably, substantially maximum write currents for the write select transistor size for programming the magnetic element 202 to either state. To write the cell 201 into a first memory state, first bit line selector 252 turns on the bit line 216 to which the cell being written is connected to, and supplies a high voltage, which may be a Vdd or another high voltage. Then the current flows from the bit line 216, through the magnetic element 202 and write select transistor 206 to the source line 208. To write the cell into a second memory state, second bit line selector 264 turns on the column of bit line 216 corresponding to the cell 201 being written and supplies a low voltage which may be a ground voltage or a negative voltage. The source line selector 266 provides either a low voltage such as Vdd/2 or a high voltage such as Vdd over the source line 208. Then the current flows from the source line 208 to the writing transistor 206, then to magnetic element 202, and then to the bit line 216.

Using the memory 250 cells on the same word line 210 can be simultaneously and independently programmed only in the case that the source line 208 is at Vdd/2. For the source line 208 being at another low voltage (such as ground) or another high voltage (such as Vdd) case, only one bit in one block is written at a time. Consequently, in one embodiment, other bits within the same byte may be arranged in other blocks corresponding to different source lines 208.

During a read operation, first bit line selector 252 activates the bit line 216 for the desired magnetic storage cell

201. The word line selector activates the read selection transistors 204 of the row corresponding to the desired magnetic storage cell 201. The bit line 216 also supplies a reading voltage. The second bit line selector 264 activates the transistor 268 that allows the corresponding sense line 214 to provide the signal into the differential current sensor 260. To provide a reference for determining the state of the magnetic element 202, the reference control 256 activates the reference cells 258. Consequently, the read current flows through the magnetic element 202, through the read selection transistor 204 and sense line 214. Another read current flows through a reference element 270 in the reference cells 258. The reference element 270 may be a magnetic element, resistor, or other structure. The reference element 270 has a resistance of (Rmax+Rmin)/2, where Rmax is the resistance of the magnetic element in the high resistance state and Rmin is the resistance of the magnetic element in the low resistance state. Thus a reference signal is also provided to the differential current sensor 260. A comparator 262 compares the two signals, and provides an output voltage depending on the state of the memory. For simplicity, only one differential current sensor 260 and one comparator 262 are shown. This architecture only allows sequential sensing or reading of cells in parallel. To allow for simultaneous sensing or reading memory operation, more differential current sensors (not shown) and comparators (not shown) may be added.

Furthermore, the magnetic memory 250 may include error correction circuitry 257. It is possible that at least some magnetic elements 202 in the magnetic memory 250 have varying resistance, as discussed above. Resistance variation problems of magnetic element 202 might cause errors in operation of the memory 250. Consequently, error correction circuitry 257 may be provided. Error correction circuitry 257 could take various forms such as the addition of checker bits in one embodiment. In another embodiment, error correction may also include but is not limited to a self referencing scheme, described above.

Thus, the memory 250 and the cell 201 allow for differential reading. Consequently, a large read signal, high read speed, and rejection of common mode noise may be achieved. The memory 250 may also have a higher density due to a reduced size of the cell 201. The magnetic cell 201 may have a cell size less than 16 $f^2$ as discussed above for the magnetic cells 102/102' because only one bit line is used instead of two. This cell size (~10 $f^2$) is much smaller than that of the conventional MRAM 10/10', SRAM, and is in a range that is competitive with DRAM and Flash. Moreover, variations in the magnetic element(s) may be contained by error correction to reduce or eliminate memory reading errors.

Figure 10:
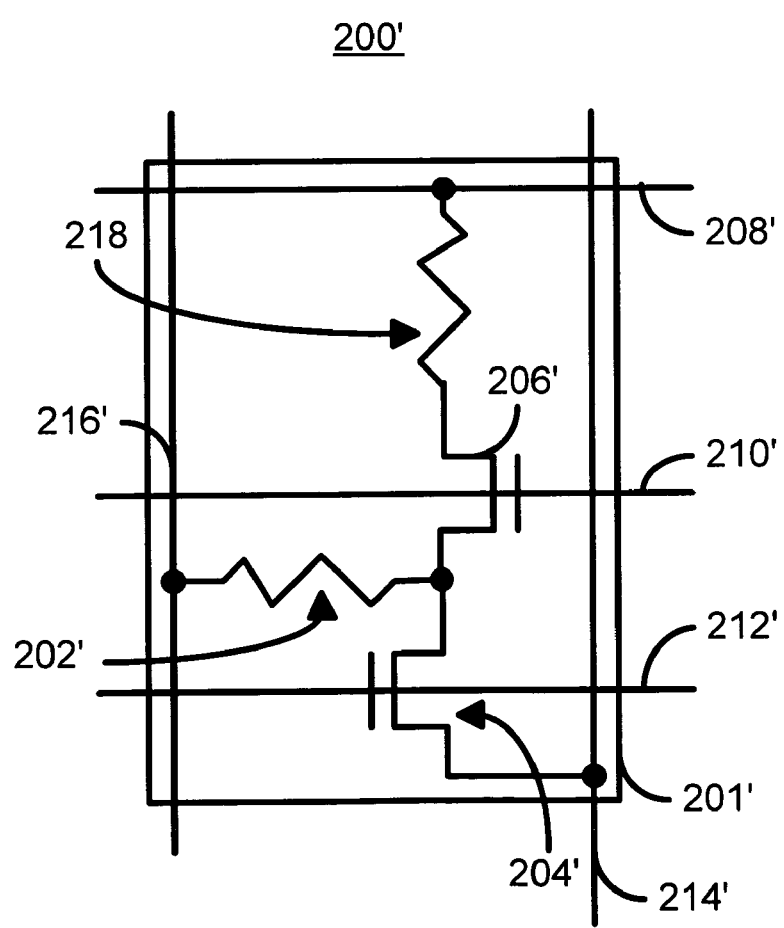
FIG. 10 is a diagram of a portion of one embodiment of a magnetic memory in accordance with the present invention.

FIG. 10 is a diagram of a portion of one embodiment of a magnetic memory 200' in accordance with the present invention. Portions of the magnetic memory 200' are analogous to the magnetic memory 200 and are, therefore, labeled similarly. The magnetic memory 200' thus includes a cell 201' including a magnetic element 202', dummy element 218, read selection transistors 204', and write selection transistor 206'. The magnetic memory 200' also includes source line 208', word lines 210' and 212', sense line 214', and bit line 216'. The magnetic element 202' is programmed by driving a write current through the magnetic element 202'. Thus, the magnetic element 202' is programmed using spin transfer. The magnetic element 202' provides a signal via magnetoresistance. In one embodiment, the magnetic element 202' may be a MTJ, dual MTJ, or other magnetic element which can be programmed using spin transfer and which provide a read signal using magnetoresistance. The transistors 204' and 206' are preferably CMOS transistors. The dummy element 218 is preferably a magnetic element such as an MTJ or a resistor.

The magnetic memory 200' functions in substantially the same manner as the magnetic memory 200. However, because of the dummy element 218, the path which the write current follows from the write selection transistor 206' to ground is symmetric. Consequently, the write current may be equal when writing the magnetic element 202' to either state. Moreover, in one embodiment, the write selection transistor is configured to provide substantially a maximum current.

Figure 11:
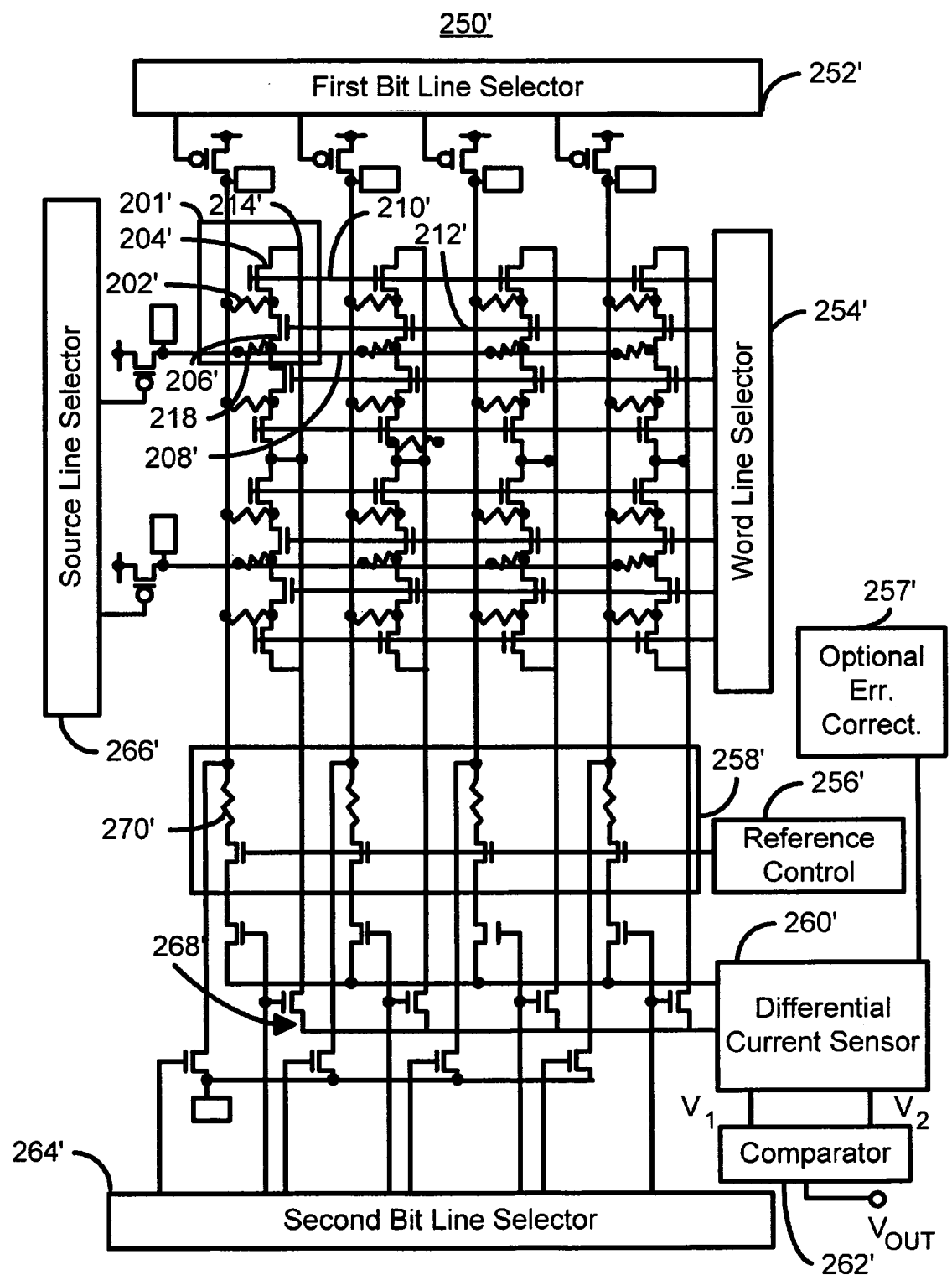
FIG. 11 is a diagram of a portion of another embodiment of a magnetic memory in accordance with the present invention.

FIG. 11 is a diagram of a portion of another embodiment of a magnetic memory 250' in accordance with the present invention. The magnetic memory 250' utilizes the magnetic storage cells 201 shown in FIG. 10. Referring back to FIG. 10, the magnetic memory 250' is also analogous to the magnetic memory 250. Consequently, analogous elements are labeled similarly. Thus, the magnetic memory 250' includes magnetic storage cell 201' including a magnetic element 202', and read selection transistors 204', write selection transistor 206', and dummy elements 218'. The magnetic memory 250' also includes a source line 208', word lines 210' and 212', bit line 216', first bit line selector 252', word line selector 254', reference control 256', reference cells 258', differential current sensor 260', comparator 262', second bit line selector 264', source line selector 266', transistor 268', and reference element 270'. The first bit line selector 252' and source line selector 266' control power and current source(s), while the second bit line selector 264' controls current sink(s). The word line selector 254' controls both read selection transistor 204' and write selection transistor 206'. Reference control 256' controls the reference cells 258' for reading. The differential current sensor 260' is coupled with the reference sells 258' and selectively coupled with the appropriate one(s) of the magnetic storage cells 201'. The differential current sensor 260' and comparator 262' are used to provide differential reading of the magnetic element 202'. In an alternate embodiment another read scheme and/or voltage based reading could be used.

The magnetic memory 250' functions in substantially the same manner as the magnetic memory 250. However, because of the dummy element 218, the path which the write current follows from the write selection transistor 206' to ground is symmetric. Consequently, the write current may be equal when writing the magnetic element 202' to either state. In one embodiment, the write selection transistor 206' is also configured to provide substantially a maximum write current for the write selection transistor size.

Thus, the memory 250' and the cell 201' allow for differential reading. Consequently, a large read signal, high read speed, and rejection of common mode noise may be achieved. The memory 250' may also have a higher density due to a reduced size of the cell 201'. The magnetic cell 201' may have a cell size less than 16 $f^2$ as discussed above for the magnetic cells 102/102', since only one bit line is used instead of two. This cell size (~10 $f^2$) is much smaller than that of the conventional MRAM 10/10', SRAM, and is in a range that is competitive with DRAM and Flash. Moreover, due to the dummy element 218, the magnetic memory 250' may provide a symmetric write current through the write selection transistor 206'. The memory 250' may also include error correction circuitry 257' analogous to that described above.

Figure 12:
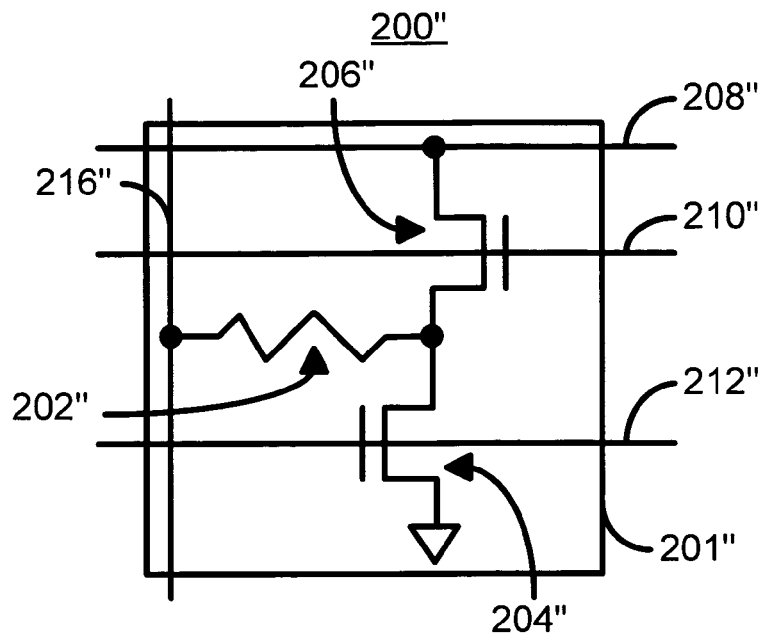
FIG. 12 is a diagram of a portion of another embodiment of a magnetic memory in accordance with the present invention.

FIG. 12 is a diagram of a portion of another embodiment of a magnetic memory 200" in accordance with the present invention. Portions of the magnetic memory 200" are analogous to the magnetic memory 200 and are, therefore, labeled similarly. The magnetic memory 200" thus includes a cell 201" including a magnetic element 202", read selection transistors 204", and write selection transistor 206". The magnetic memory 200" also includes source line 208", word lines 210" and 212", and bit line 216". The magnetic element 202" is programmed by driving a write current through the magnetic element 202". Thus, the magnetic element 202" is programmed using spin transfer. The magnetic element 202" provides a signal via magnetoresistance. In one embodiment, the magnetic element 202" may be a MTJ, dual MTJ, or other magnetic element which can be programmed using spin transfer and which provide a read signal using magnetoresistance. The transistors 204" and 206" are preferably CMOS transistors. The read select transistor 202" has one end tied to ground. Consequently, instead of using a sense line, the bit line 216" also functions as a sense line.

Figure 13:
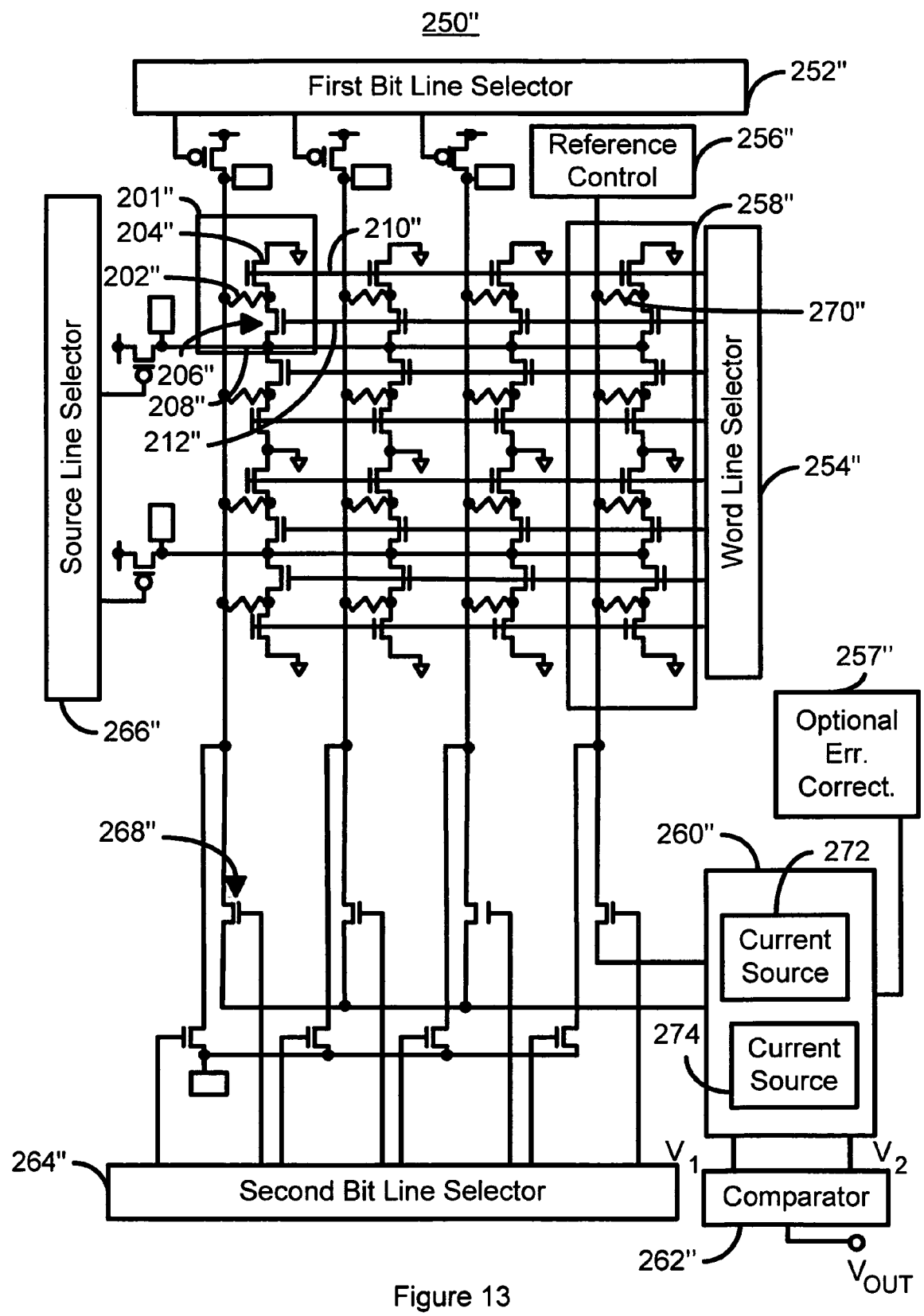
FIG. 13 is a diagram of a portion of another embodiment of architecture of a magnetic memory in accordance with the present invention.

FIG. 13 is a diagram of a portion of another embodiment of architecture 250" of a magnetic memory in accordance with the present invention. The magnetic memory 250" utilizes the magnetic storage cells 201" shown in FIG. 12. Referring back to FIG. 13, the magnetic memory 250" is also analogous to the magnetic memory 250. Consequently, analogous elements are labeled similarly. Thus, the magnetic memory 250" includes magnetic storage cell 201" including a magnetic element 202", and read selection transistors 204", and write selection transistor 206". The magnetic memory 250" also includes a source line 208", word lines 210" and 212", bit line 216", first bit line selector 252", word line selector 254", reference control 256", reference cells 258", differential current sensor 260", comparator 262", second bit line selector 264", source line selector 266", transistor 268", reference element 270" and current sources 272 and 274.

The first bit line selector 252" and source line selector 266" control power and current source(s), while the second bit line selector 264" controls current sink(s). The word line selector 254" controls both read selection transistor 204" and write selection transistor 206". In one embodiment, the write select transistor 206" is configured to provide equal write currents for programming the magnetic element 202" to either state. Reference control 256" controls the reference cells 258" for reading. The differential current sensor 260" is coupled with the reference cells 258 and selectively coupled with the appropriate one(s) of the magnetic storage cells 201". The differential current sensor 260" and comparator 262" are used to provide differential reading of the magnetic element 202". In an alternate embodiment another read scheme and/or voltage based reading could be used.

The magnetic memory 250" is analogous to the magnetic memory 250. However, one end of the read transistor 204" is grounded. In addition, the reference cells 258" are configured as a column, rather than a row. Moreover, the differential current sensor 260" preferably includes current sources 272 and 274.

The magnetic memory 250" performs a write operation in substantially the same manner as for the magnetic memory 250. Moreover, the magnetic memory 250" may be configured to provide at or close to maximum write current for the transistor size. A read operation is also performed in substantially the same manner. However, instead of activating a sense line (which is not present in the magnetic memory 250"), the second bit line selector 264" selects the bit line 216" by activating the transistor 268". Thus, the bit line 216" is coupled to the differential current sensor 260".

The current sources 272 and 274 are preferably identical. One current source 272 provides current for the bit line 216", while the other current source 274 provides current to the reference cells 258". In a preferred embodiment, a portion of the current from the current source 272 is provided to the bit line 216", with a clamped bit line bias voltage. In one embodiment, the bit line bias voltage is clamped in the range of 50-500 mV regardless of the resistance of the magnetic element 202". Consequently, a high MR signal can be obtained during sensing by using an Op-Amp and a transistor (not shown). The remainder of the current from the current source 272 is provided to a resistor or another transistor (not shown), to amplify and sense the voltage drop. In a preferred embodiment, the current sensed is the difference between a constant supply current and the current that actually flows through the MTJ element. The current from the current source 274 is divided in a similar manner between a reference element 270" in the reference cells 258" and a resistor or transistor (not shown) used to amplify and sense the voltage drop. The comparator 262" may be a two-stage comparator to obtain an output that has the correct polarity depending on whether the magnetic element 202" being sensed has higher resistance than the reference element 270".

Thus, the memory 250" and the cell 201" allow for differential reading. Consequently, a large read signal, high read speed, and rejection of common mode noise may be achieved. The memory 250" may also have a higher density due to a reduced size of the cell 201". The magnetic cell 201" may have a cell size less than 16 $f^2$ as discussed above for the magnetic cells 102/102', since only one bit line is used instead of two. This cell size (~10 $f^2$) is much smaller than that of the conventional MRAM 10/10', SRAM, and is in a range that is competitive with DRAM and Flash. Moreover, the elimination of the sense line in favor of using the bit line 216" for multiple purposes may further reduce the size of the magnetic storage cell 201". Consequently, an even higher density magnetic memory may be achieved. Moreover, the magnetic memory 250" may include error correction circuitry 257" analogous to that described previously.

Figure 14:
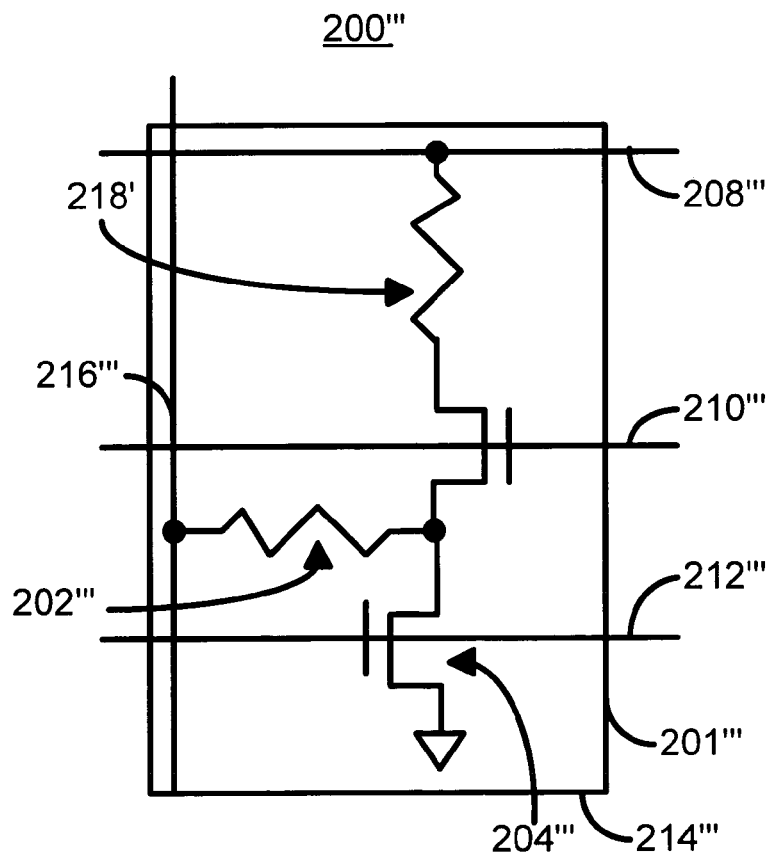
FIG. 14 is a diagram of a portion of one embodiment of a magnetic memory in accordance with the present invention.

FIG. 14 is a diagram of a portion of one embodiment of a magnetic memory 200''' in accordance with the present invention. Portions of the magnetic memory 200''' are analogous to the magnetic memory 200" and are, therefore, labeled similarly. The magnetic memory 200''' thus includes a cell 201''' including a magnetic element 202''', dummy element 218', read selection transistors 204''', and write selection transistor 206'''. The magnetic memory 200''' also includes source line 208''', word lines 210''' and 212''', and bit line 216'''. The magnetic element 202''' is programmed by driving a write current through the magnetic element 202'''. Thus, the magnetic element 202''' is programmed using spin transfer. The magnetic element 202''' provides a signal via magnetoresistance. In one embodiment, the magnetic element 202''' may be a MTJ, dual MTJ, or other magnetic element which can be programmed using spin transfer and which provide a read signal using magnetoresistance. The transistors 204''' and 206''' are preferably CMOS transistors. The dummy element 218' is preferably a magnetic element such as an MTJ or a resistor.

The magnetic memory 200''' functions in substantially the same manner as the magnetic memory 200". However, because of the dummy element 218', the path which the write current follows from the write select transistor 206''' to ground is symmetric. Consequently, the amplitude of the write current may be equal when writing the magnetic element 202''' to either state. The magnetic memory could be used in an architecture similar to the magnetic memory 250". In such a magnetic memory, the benefits of the magnetic memory 250" may be achieved. In addition, a symmetric write current through the write selection transistor 206" would be provided.

Figure 15:
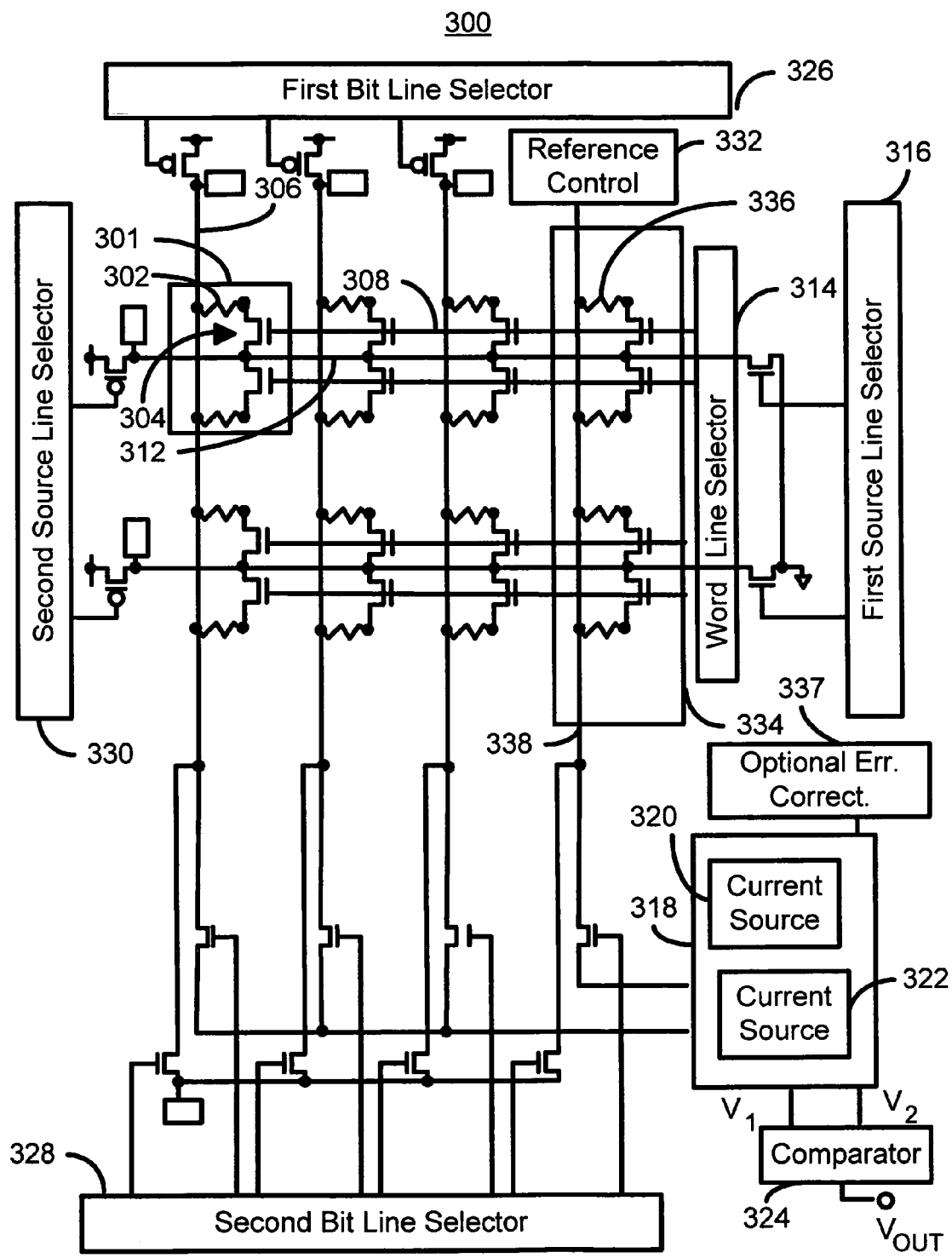
FIG. 15 is a diagram of a portion of another embodiment of architecture of a magnetic memory in accordance with the present invention.

FIG. 15 is a diagram of a portion of another embodiment of architecture of a magnetic memory 300 in accordance with the present invention. The magnetic memory includes magnetic storage cell 301 including a magnetic element 302 and a selection transistor 304, bit line 306, word line 308, source lines 312, word line selector 314, first source line selector 316, differential current sensor 318 including current sources 320 and 322, comparator 324, first bit line selector 326, second bit line selector 328, second source line selector 330, reference control 332, reference cells 334 including reference elements 336, and reference bit line 338. The reference element 336 has a resistance in is preferably a magnetic element or multiple elements with a resistance of (Rmax+Rmin)/2, where Rmax is the magnetic element in the high resistance state and Rmin is the resistance of the magnetic element in the low resistance state.

Each magnetic storage cell 301 includes a single magnetic element 302 and a single selection transistor 304. The magnetic element 302 is programmed by driving a write current through the magnetic element 301. Thus, the magnetic element 302 is programmed using spin transfer. The magnetic element 302 provides a signal via magnetoresistance. In one embodiment, the magnetic element 302 may be a MTJ, dual MTJ, or other magnetic element which can be programmed using spin transfer and which provide a read signal using magnetoresistance. The selection transistor 304 is preferably a CMOS transistor.

The selection transistor 304 is controlled using word line 308. In one embodiment, the selection transistor 304 is configured to provide equal write currents for programming the magnetic element 302 to either state. Moreover, the selection transistor 304 may be configured to provide at or close to maximum write current for the selection transistor size. The source line 312 is preferably perpendicular to the bit line 306 and parallel to the word line 308. In the embodiment depicted, the magnetic storage cell 301 includes the magnetic element 302 and the selection transistor 304. In another embodiment, the magnetic storage cell 301 might also include a dummy element (not shown). In such an embodiment, the magnetic storage cell 301 may be configured such that the selection transistor 304 resides between the dummy element and the magnetic element 302. Stated differently, the magnetic element 302 would be coupled to the source of the selection transistor 304 and the dummy element would be coupled to the drain of the selection transistor 304, or vice versa. The dummy element is preferably a magnetic element such as an MTJ or a resistor. In such an embodiment, use of the dummy element may provide a symmetric path for the write current, allowing write currents potentially equal in magnitude for opposite direction writing currents (programming the magnetic element 302 to different states).

The reference cells 336 are used to provide a reference signal during a read operation. In a preferred embodiment, the reference element 336 has a resistance of (Rmax+Rmin)/2. Consequently, the resistance of the reference element 336 is preferably an average of the first and second states. However, in another embodiment, the reference element 336 may have a different resistance. In addition, although only one set of reference cells 334 (i.e. a column) with one reference element 336 per column are depicted, another number or elements corresponding to another number of columns may be used. For example, more reference elements (not shown) or more sets of reference cells may be added to obtain a better averaged mid-point resistance value as a reference.

The differential current sensor 318 and comparator 324 are used in performing differential reading of the magnetic memory cells 302. In an alternate embodiment another read scheme and/or voltage based reading could be used. Although only one differential current sensor 318 and one comparator 324 are depicted, in another embodiment, multiple differential current sensors 318 and multiple comparators 324 can be used. In such an embodiment, cells 301 may be read in parallel.

To write to a magnetic cell 301, the word line selector 314 activates the row of selection transistors 304 by enabling the word line 308. This step is carried out regardless of the state being programmed to the magnetic element 302. The row includes the target magnetic storage cell 301 desired to be written. To writing to a first memory state, the first bit line selector 326 turns on and supplies a high voltage to the bit line 306. The high voltage may be $V_{DD}$ or a different voltage. The second source line selector 330 turns on the source line 312 connected to row of cells that has the cell 301 being written. Through the source line 312, a low voltage is supplied for the first memory state. The low voltage may, for example, be $V_{DD}/2$ or ground voltage. Consequently, a write current passes from the bit line 306, through the magnetic element 302 being written, trough selection transistor 304 and to the source line 312. In one embodiment, this first memory state corresponds to the current flowing through an MTJ from top to bottom. To write to the second state, the second bit line selector 328 provides a low voltage to the bit line 306. This low voltage may, for example, be ground or a negative voltage. The source second line selector 330 enables the source line 312 and supplies a high voltage. This high voltage may, for example, be a voltage of $V_{DD}/2$ or a high voltage such as $V_{DD}$. Consequently, a write current passes from the source line 312, through the selection transistor 304, then through the magnetic element 302 and through the bit line 306. In one embodiment, the second memory state corresponds to the write current flowing through the MTJ from bottom to top. In an alternate embodiment, when the bit line 306 is at a high voltage, the source line 312 may be set at ground voltage to write one state. When the bit line 306 is at a low voltage, the source line 312 may be set at a high voltage such as $V_{DD}$. Although programming is possible, this alternate embodiment does not permit simultaneous writing of opposite bits (sharing a word line 308 and a source line 312) in the same block. Therefore, different bits in the same byte are preferably placed into different blocks in such an embodiment.

For a read operation, second bit line selector 328 activates the bit line 306 corresponding to the desired cell 301 being read. In addition, the second bit line selector 328 activates the reference bit line 338 for the reference cells 334. The word line selector 314 enables the selection transistors 304 for the row in which the desired magnetic storage cell 301 resides. The current source 320 of the differential current sensor 318 is used to provide current to the target bit line 306. The current source 322, however, is used to provide current to the reference bit line 338. A portion of the current from the current source 320 is provided through the bit line 306 with the bit line bias voltage clamped, preferably in the range of 50-500 mV regardless of MTJ element resistance. As a result, a high MR signal can be obtained during sensing. This high MR signal may be achieved with an Op-Amp and a transistor (not shown). The rest of the current from the current source 320 is provided through a resistor or another transistor (not shown), where the subsequent voltage drop can be amplified and sensed. The current being sensed is the difference between a constant supply current and the current that actually flows through the MTJ element. The current source 322 is configured in a similar manner so that a portion of the current is provided to the reference element 336, while a remaining portion of the current is provided to a resistor or transistor (not shown). The comparator 324 compares the output of the differential current sensor 318 to determine the state of the magnetic cell. In one embodiment, the comparator 324 may be a two-stage comparator. In such an embodiment, the output of the comparator 324 may have the correct polarity that depends on whether the magnetic element 302 being sensed has higher resistance than the reference element 336.

Thus, the memory 300 and the cell 301 allow for differential reading. Consequently, a large read signal, high read speed, and rejection of common mode noise may be achieved. The memory 300 may also have a higher density due to a reduced cell size. The magnetic cell 301 may have a cell size less than 16 f$^2$ as discussed above for the magnetic cells 102/102', since only one bit line and one transistor are used. This cell size (~6-8 f$^2$) is much smaller than that of the conventional MRAM 10/10', SRAM, and is in a range that is competitive with DRAM and Flash. Moreover, the elimination of a word line and read or write selection transistor in favor of using a single selection transistor 304 for multiple purposes may further reduce the size of the magnetic storage cell 301. Consequently, an even higher density magnetic memory may be achieved. Moreover, the magnetic memory 300 may include error correction circuitry 337 analogous to that described previously.

Figure 16:
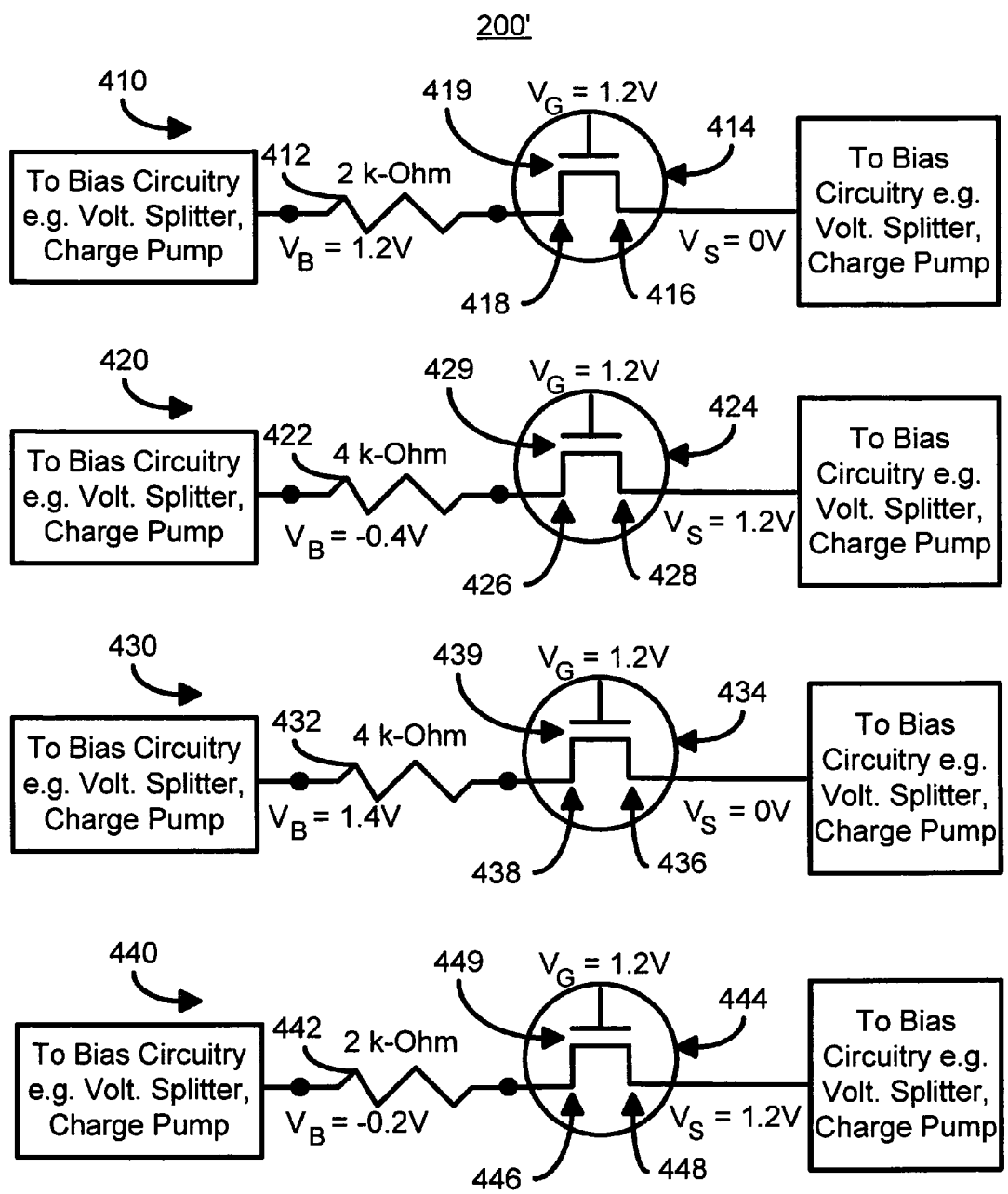
FIG. 16 is a diagram illustrating embodiments of portions of architectures that utilize symmetric, preferably maximum writing currents.

FIG. 16 is a diagram illustrating embodiments of configurations 410, 420, 430 and 440 of an architecture 400 that may provide close to maximum write currents that are symmetric. Stated differently, the configurations 410, 420, 430, and 440 may provide maximum write currents for a given transistor size regardless of the state being written. Thus, the discussion for the configurations 410, 420, 430, and 440 may be applied to the memories 100, 130, 130', 200, 200', 200'', 200''', 250, 250', 250'', and 300. For all configurations 410, 420, 430, and 440, Eqs. (2) and (3) indicate that the maximum current may be obtained by maintaining a maximum allowable gate-source voltage ($V_{GS}$) in conjunction with the drain-source voltage ($V_{DS}$) being greater than or equal to the gate-source voltage ($V_{GS}$) minus the transistor threshold voltage ($V_T$). For the configurations 410, 420, 430, and 440, the $V_{GS}$ is 1.2 V for 90 nm node and $V_T$ is 0.2v. Consequently, so $V_{DS}$ is greater than 1.0v. Note that the numbers used in explaining the configurations 410, 420, 430, and 440 are for exemplary purposes only and the analysis applies to other transistors and other voltages.

The configuration 410 includes a magnetic element 412 and a transistor 414 having a source 416, a drain 418, and a gate 419. The magnetic element 412 is connected to the drain 416 of the transistor 414, while the source 416 is grounded. Therefore $V_{GS}$=1.2v and $V_{DS}$=1.0v, assuming that the equivalent drain-source resistance is 10 kΩ current through the MTJ and the transistor is 100 uA. The transistor 414 and the magnetic element 412 may also be coupled to additional circuitry in order to provide the desired bias voltages to the transistor 414 and the magnetic element 412. For example, the transistor 414 and the magnetic element 412 may be coupled with charge pump(s) and/or voltage dividers to provide a voltage greater than the $V_{DD}$ or to provide a negative voltage to the transistor 414 and the magnetic element 412.

The configuration 420 includes a magnetic element 422 and a transistor 424 having a source 426, a drain 428, and a gate 429. The magnetic element 422 is connected to the source 426 of the transistor 424. In the configuration 420, a negative voltage is applied at the bit line end, at the end of the magnetic element 422. The value of this negative voltage is chosen such that the effective voltage between the other end of the magnetic element 422 and the source contact of the transistor is close to ground voltage. A 100 uA current flowing through the transistor will result in a $V_{DS}$ of 1.2v and a voltage of 0.4v over the magnetic element 422. Therefore $V_{GS}$=1.2v and $V_{DS}$=1.2v, satisfying the conditions for maximum transistor $I_D$ current. In this example, the source line end is set at either 0v (ground) or 1.2v ($V_{DD}$), while the bit line end voltage is set either 1.2v or −0.4v. The transistor 424 and the magnetic element 422 may be coupled to additional circuitry in order to provide the desired bias voltages to the transistor 424 and the magnetic element 422. For example, the transistor 424 and the magnetic element 422 may be coupled with charge pump(s) and/or voltage dividers to provide a voltage greater than the $V_{DD}$ or to provide a negative voltage to the transistor 424 and the magnetic element 422. For example, the configuration 420 utilizes an extra regulated voltage supply of −0.4v. A negative supply voltage can be generated with charge pumps which can invert a supply voltage of $V_{DD}$. A voltage splitter can be designed to extract the desired negative voltage such as −0.4v from the inverted −$V_{DD}$ voltage. These extra circuits take up more area. However, because the extra circuit is outside the main memory array, its increase on memory chip size is minimal. Moreover, because the maximum current condition is met for writing both states of the magnetic element 422, the transistor size is a minimum sized transistor. Consequently, the densest (~6-8 f$^2$) cell size with maximum writing current capability may be achieved.

The configuration 430 includes a magnetic element 432 and a transistor 434 having a source 436, a drain 438, and a gate 439. The magnetic element 432 is connected to the drain 438 of the transistor 434. For the configuration 430, the Rmin and Rmax of the magnetic element 432 are opposite to those in the configurations 410 and 420. In the configuration 430, the source 436 line end is grounded. Consequently, $V_{GS}$=1.2v. The bit line end voltage applied to the magnetic element 432 is at 1.4v. The transistor 434 and the magnetic element 432 may also be coupled to additional circuitry in order to provide the desired bias voltages to the transistor 434 and the magnetic element 432. For example, the transistor 434 and the magnetic element 432 may be coupled with charge pump(s) and/or voltage dividers to provide a voltage greater than the $V_{DD}$ or to provide a negative voltage to the transistor 434 and the magnetic element 432. Thus, a voltage higher than $V_{DD}$ can be generated with charge pumps which can double $V_{DD}$. A voltage splitter can be designed to extract the desired voltage such as 1.4v from 2$V_{DD}$. Consequently, the magnetic element 432 has a 0.4v voltage drop and $V_{DS}$=1.0V. Conditions for the transistor 434 to pass maximum current of 100 uA are achieved.

The configuration 440 includes a magnetic element 442 and a transistor 444 having a source 446, a drain 448, and a gate 449. The magnetic element 442 is connected to the source 446 of the transistor 444. For the configuration 440, the Rmin and Rmax of the magnetic element 442 are opposite to those in the configurations 410 and 420. In the configuration 440, negative voltage, −0.2v, is applied at the bit line end, at the end of the magnetic element 442. In addition, a voltage 1.2v is applied at the drain 448. In this configuration, $V_{DS}$=1.2v and the magnetic element 442 has a voltage drop of 0.2v across the magnetic element 442. The effective source voltage for the transistor 444 is close to ground, so that $V_{GS}$=1.2v, satisfying condition for maximum transistor $I_D$ current. In this example, the source line end voltage is at either 0v (ground) or 1.2v ($V_{DD}$), while the bit line end voltage is at either 1.4v or −0.2v. Therefore both positive voltage supply greater than $V_{DD}$ and negative voltage supply smaller than $V_{DD}$ in value are used. The transistor 444 and the magnetic element 442 may also be coupled to additional circuitry in order to provide the desired bias voltages to the transistor 444 and the magnetic element 442. For example, the transistor 444 and the magnetic element 442 may be coupled with charge pump(s) and/or voltage dividers to provide a voltage greater than the $V_{DD}$ or to provide a negative voltage to the transistor 444 and the magnetic element 442.

Thus, using configurations analogous to configurations 410, 420, 430, and 440, it can be assured that the write select transistor carries a maximum current for programming either state into the magnetic element. As discussed above, positive voltages higher than $V_{DD}$ and negative voltages can be obtained by using charge pumps and voltage splitters in the memory circuit. These circuit techniques may become critical as the critical dimension decreases further for future memory generations. As the transistor dimension shrinks, the circuit supply voltage decreases accordingly. The required optimum writing and reading voltages for the magnetic tunnel junction memory elements may not decrease at the same speed. Thus charge pump and voltage splitter techniques become critical to operate the magnetic tunnel junction elements in optimum conditions.

Figure 17:
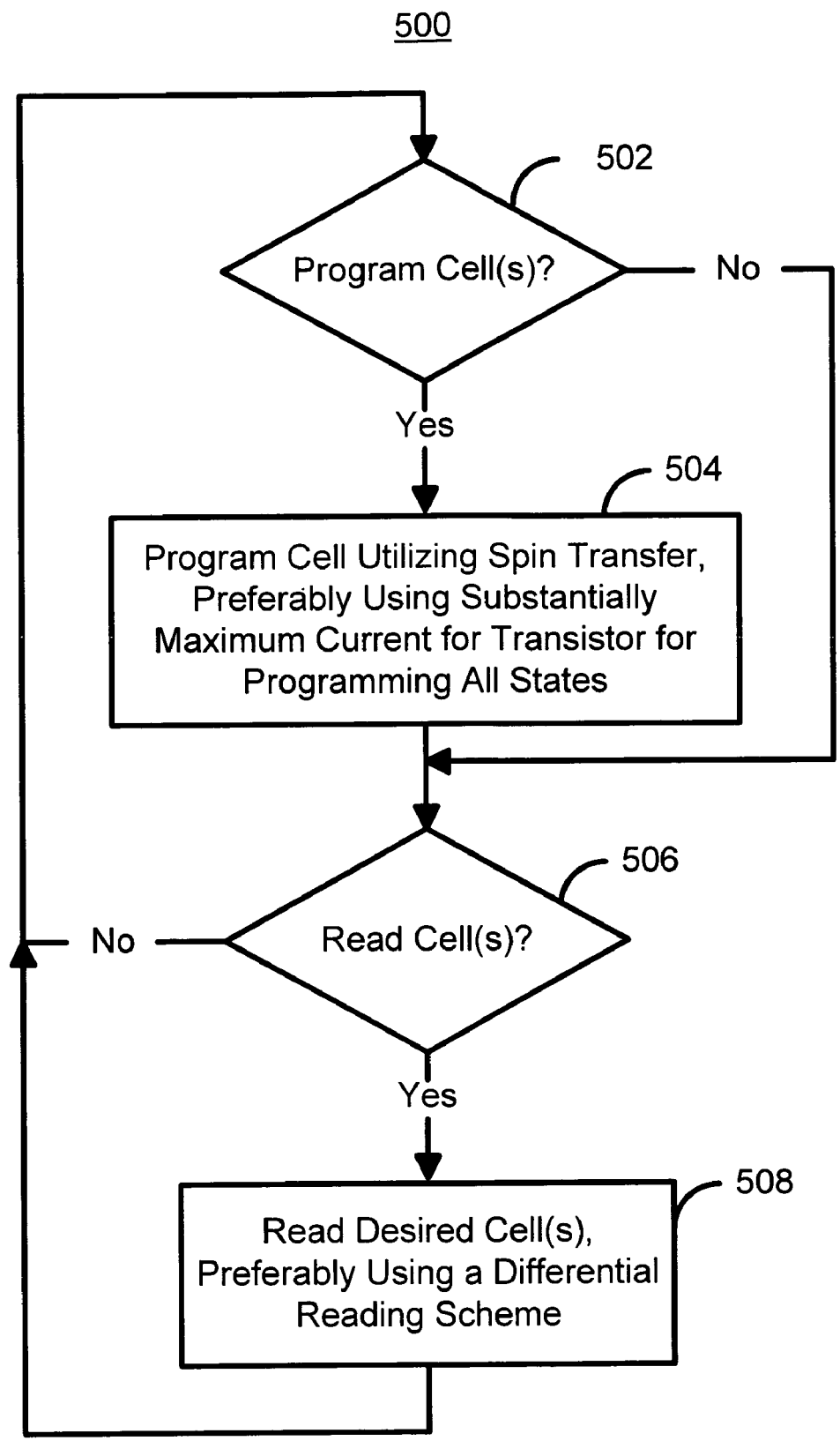
FIG. 17 is a flow chart depicting one embodiment of a method for utilizing a magnetic memory in accordance with the present invention.

FIG. 17 is a flow chart depicting one embodiment of a method 500 for utilizing a magnetic memory in accordance with the present invention. The method 500 is used with the memory 100, 130, 130', 200, 200', 200", 200"', 250, 250', 250", and/or 300. It is determined whether a write operation is to be performed, via step 502. If a write operation is to occur, then the appropriate voltages and/or currents are provided to write to the desired magnetic storage cell(s), via step 504. In a preferred embodiment, the voltages provided across the write selection transistor(s) in step 504 are selected to provide a write current that is substantially a maximum current allowed by the write selection transistor(s). Thus, the voltages provided in step 504 are analogous to those discussed above in FIG. 16. Referring back to FIG. 17, if a write operation is not to be performed, then it is determined whether a read operation is to be performed, via step 506. If so, then the appropriate voltages and/or currents are provided and the state(s) of the magnetic element(s) in the desired magnetic storage cell(s) determined, via step 508. Step 508 preferably determines the state of the magnetic element(s) using a differential reading scheme. Thus, using the method 500, the memory 100, 130, 130', 200, 200', 200", 200"', 250, 250', 250", and/or 300 can be utilized. As a result, magnetic memories utilizing a localized phenomenon for writing, having a reduced cell size, and utilizing a faster reading scheme may be provided and used.

A method and system for providing and using a magnetic memory has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A magnetic memory comprising:

a plurality of magnetic storage cells, each of the plurality of magnetic storage cells including a magnetic element and a selection transistor, the magnetic element capable of being programmed using spin transfer induced switching by a write current driven through the magnetic element, the selection transistor including a source and a drain, the plurality of magnetic storage cells being grouped in pairs, the source of the selection transistor for one magnetic storage cell of a pair sharing the source with the selection transistor for another magnetic storage cell of the pair, the selection transistor configured such that the write current is driven through the magnetic element during the writing of the magnetic element;

a plurality of bit lines coupled with the plurality of magnetic storage cells and for carrying the write current or the read current, a portion of the plurality of bit lines being held at a particular voltage when selected; and a plurality of bit line selectors coupled with the bit lines, the plurality of bit line selectors configured to activate a portion of the plurality of bit line to provide the write current in a desired direction to each of the plurality of magnetic storage cells; and a plurality of source lines coupled with the plurality of magnetic storage cells and carrying an additional voltage when activated, the additional voltage having a value smaller or larger than the particular voltage to provide the write current in a desired direction; and a plurality of source line selectors coupled with the plurality of source lines and for activating a portion of the plurality of source lines.

2. The magnetic memory of claim 1 further comprising:

a plurality of reference cells;

at least one differential sensor coupled with the plurality of magnetic storage cells and the plurality of reference cells; and at least one comparator coupled with the at least one differential sensor.

3. The magnetic memory of claim 2 wherein each of the at least one differential sensor includes at least one differential current sensor.

4. The magnetic memory of claim 1 further comprising:

error correction circuitry coupled with the plurality of magnetic storage cells.

5. The magnetic memory of claim 1 wherein the selection transistor is configured such that the write current is substantially a maximum allowable current for the transistor regardless of a state of the at least one magnetic element being written.

6. The magnetic memory of claim 5 wherein the selection transistor is configured to maintain a maximum rated gate-source voltage and a drain-source voltage that is not less than a gate-source voltage minus a transistor threshold voltage.

7. The magnetic memory of claim 5 further comprising:

at least one of at least one charge pump and at least one voltage splitter coupled with the selection transistor and the magnetic element, thereby providing at least one positive voltages higher than a supply voltage at a particular portion of the selection transistor and the magnetic element.

8. The magnetic memory of claim 5 further comprising:
at least one of at least one charge pump and at least one voltage splitter coupled with the selection transistor and the magnetic element, thereby providing at least one negative voltage lower than ground voltage.

9. The magnetic memory of claim 1 wherein the magnetic element has a lateral dimension of not more than one hundred sixty nanometers.

10. The magnetic memory of claim 1 wherein each of the plurality of magnetic storage cells has an area and wherein the magnetic element has a lateral dimension, the area being not more than sixteen times the square of the lateral dimension.

11. The magnetic memory of claim 1 wherein each of the plurality of magnetic storage cells is configured such that the write current is a symmetric write current.

* * * * *